United States Patent
Ching et al.

(10) Patent No.: US 12,021,042 B2
(45) Date of Patent: Jun. 25, 2024

(54) SEMICONDUCTOR PACKAGE AND METHOD OF MANUFACTURING THE SAME

(71) Applicant: Taiwan Semiconductor Manufacturing Company, Ltd., Hsinchu (TW)

(72) Inventors: Kai-Ming Ching, Hsinchu County (TW); Shu-Shen Yeh, Taoyuan (TW); Chien-Hung Chen, Taipei (TW); Hui-Chang Yu, Hsinchu County (TW); Yu-Min Cheng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/187,662

(22) Filed: Mar. 21, 2023

(65) Prior Publication Data

US 2023/0230935 A1  Jul. 20, 2023

Related U.S. Application Data

(63) Continuation of application No. 17/203,732, filed on Mar. 16, 2021, now Pat. No. 11,637,072.

(Continued)

(51) Int. Cl.
*H01L 25/16* (2023.01)
*H01L 21/50* (2006.01)
(Continued)

(52) U.S. Cl.
CPC ............ *H01L 23/552* (2013.01); *H01L 21/50* (2013.01); *H01L 23/16* (2013.01); *H01L 23/31* (2013.01); *H01L 23/3107* (2013.01); *H01L 23/49827* (2013.01); *H01L 23/5226* (2013.01); *H01L 23/5384* (2013.01); *H01L 24/08* (2013.01); *H01L 24/16* (2013.01); *H01L 24/17* (2013.01); *H01L 24/32* (2013.01);
(Continued)

(58) Field of Classification Search
CPC ....... H01L 23/552; H01L 23/16; H01L 23/31; H01L 23/3107; H01L 23/49827; H01L 23/5226; H01L 23/5384; H01L 25/0652; H01L 25/165
See application file for complete search history.

(56) References Cited

U.S. PATENT DOCUMENTS 8,993,380 B2  3/2015  Hou et al.
9,000,584 B2  4/2015  Lin et al.
(Continued)

*Primary Examiner* — Peniel M Gumedzoe
(74) *Attorney, Agent, or Firm* — JCIPRNET

(57) ABSTRACT

A semiconductor package includes a substrate, a semiconductor die, a ring structure and a lid. The semiconductor die is disposed on the substrate. The ring structure is disposed on the substrate and surrounds the semiconductor die, where a first side of the semiconductor die is distant from an inner sidewall of the ring structure by a first gap, and a second side of the semiconductor die is distant from the inner sidewall of the ring structure by a second gap. The first side is opposite to the second side, and the first gap is less than the second gap. The lid is disposed on the ring structure and has a recess formed therein, and the recess overlaps with the first gap in a stacking direction of the ring structure and the lid.

20 Claims, 28 Drawing Sheets

Related U.S. Application Data

(60) Provisional application No. 63/110,376, filed on Nov. 6, 2020.

(51) Int. Cl.

| | | |
|---|---|---|
| *H01L 23/00* | (2006.01) | |
| *H01L 23/16* | (2006.01) | |
| *H01L 23/31* | (2006.01) | |
| *H01L 23/498* | (2006.01) | |
| *H01L 23/522* | (2006.01) | |
| *H01L 23/538* | (2006.01) | |
| *H01L 23/552* | (2006.01) | |
| *H01L 25/065* | (2023.01) | |

(52) U.S. Cl.
CPC ........ *H01L 25/0652* (2013.01); *H01L 25/165* (2013.01); *H01L 2224/08113* (2013.01); *H01L 2224/16227* (2013.01); *H01L 2224/17051* (2013.01); *H01L 2224/32245* (2013.01); *H01L 2924/16195* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2015/0162307 A1* | 6/2015 | Chen ...................... H01L 21/56 438/107 |
| 2015/0170989 A1* | 6/2015 | Dhavaleswarapu ......................... H01L 23/3675 438/122 |
| 2017/0372979 A1* | 12/2017 | Gandhi ............... H01L 23/3675 |
| 2019/0326192 A1* | 10/2019 | Eid ..................... H01L 23/3675 |
| 2021/0249326 A1* | 8/2021 | Uppal ..................... H01L 23/42 |

\* cited by examiner

SEMICONDUCTOR PACKAGE AND METHOD OF MANUFACTURING THE SAME

CROSS-REFERENCE TO RELATED APPLICATION

This application is a continuation application of and claims the priority benefit of a prior application Ser. No. 17/203,732, filed on Mar. 16, 2021, now allowed, which claims the priority benefit of U.S. provisional application Ser. No. 63/110,376, filed on Nov. 6, 2020. The entirety of the above-mentioned patent application is hereby incorporated by reference herein and made a part of this specification.

BACKGROUND

Semiconductor devices and integrated circuits (ICs) are used in a variety of electronic applications, such as personal computers, cell phones, digital cameras, and other electronic equipment. For example, the semiconductor devices and ICs are typically manufactured on a single semiconductor wafer. The dies of the wafer may be processed and packaged with other semiconductor devices, dies or components at the wafer level or after wafer-sawing, and various technologies have been developed. Semiconductor processing for fabrications of the semiconductor devices and ICs continues to evolve towards increasing device-density, higher numbers of active devices (mainly transistors) of ever decreasing device dimensions. As electronic products are continuously miniaturized, heat dissipation of the packaged semiconductor devices and ICs has become useful for packaging technology.

BRIEF DESCRIPTION OF THE DRAWINGS

Aspects of the disclosure are understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
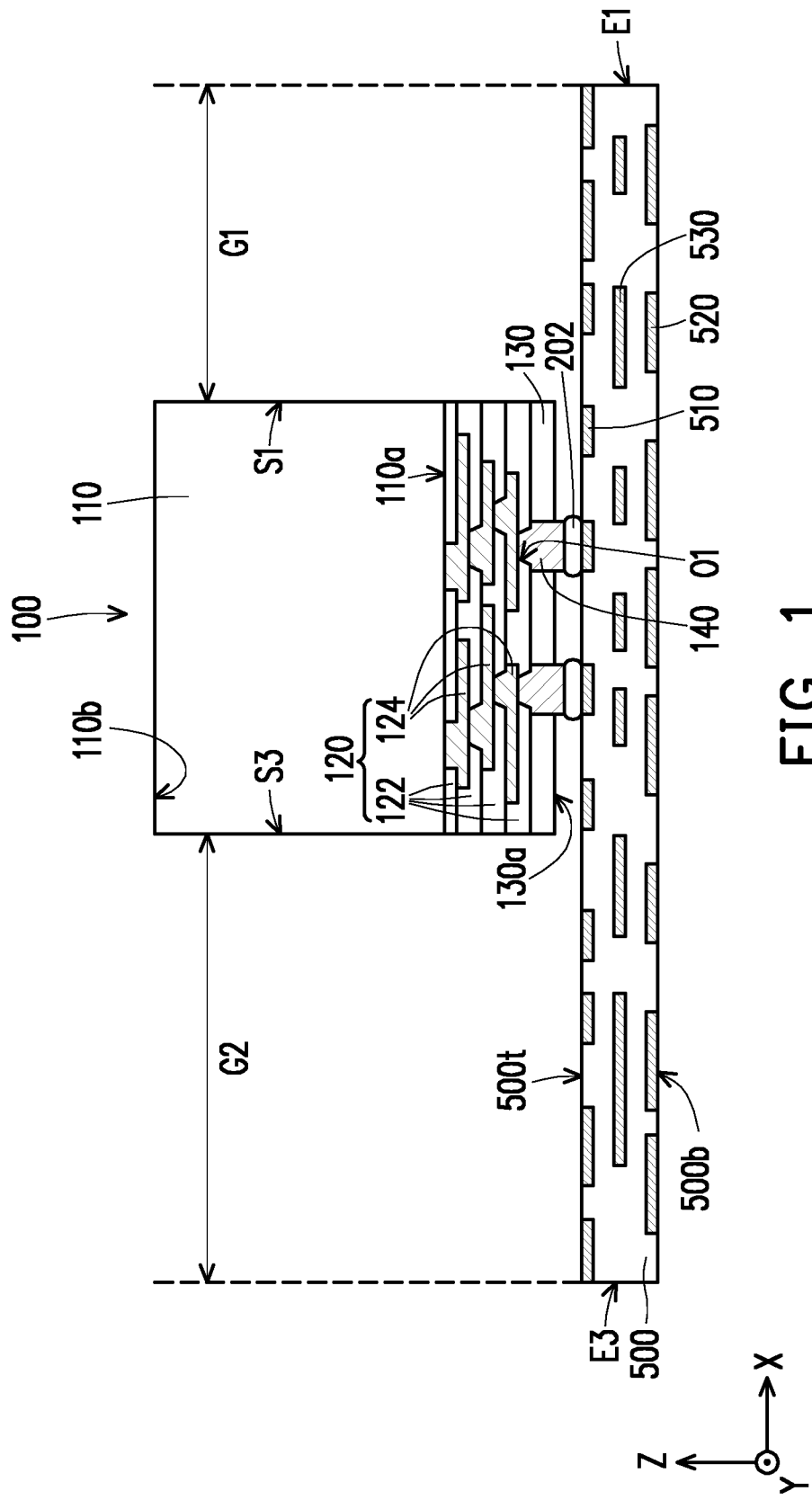
FIG. 1, FIG. 3 and FIG. 5 are schematic cross-sectional views showing a method of manufacturing a semiconductor package in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor package and the method of manufacturing the same are provided in accordance with various exemplary embodiments. Before addressing the illustrated embodiments specifically, certain advantageous features and aspects of the present disclosed embodiments will be addressed generally. The semiconductor package may be adopted for improving stress concentration and/or delamination issues during manufacturing process. Described below is a semiconductor package with a structure having a semiconductor device disposed over a substrate in an offset position (e.g., shift from a center axis of the substrate). Correspondingly, a lid including a recess corresponding to the offset position is bonded to a ring structure mounted on the substrate and surrounding the semiconductor device, which allows more flexibility in deformation ability of the lid at a location of the recess, so as to avoid or reduce stress concentration and/or delamination issues (e.g., between the lid and the ring structure). In addition to the purposes of the heat dissipation, the lid, the ring structure and the adhesives adopted to fix the lid and the ring structure onto the substrate are together constitute an electromagnetic interference shielding structure for the semiconductor element. The intermediate stages of forming the semiconductor package are illustrated in accordance with some embodiments. Some variations of some embodiments are discussed. Throughout the various views and illustrative embodiments, like reference numbers are used to designate like elements.

Figure 2:
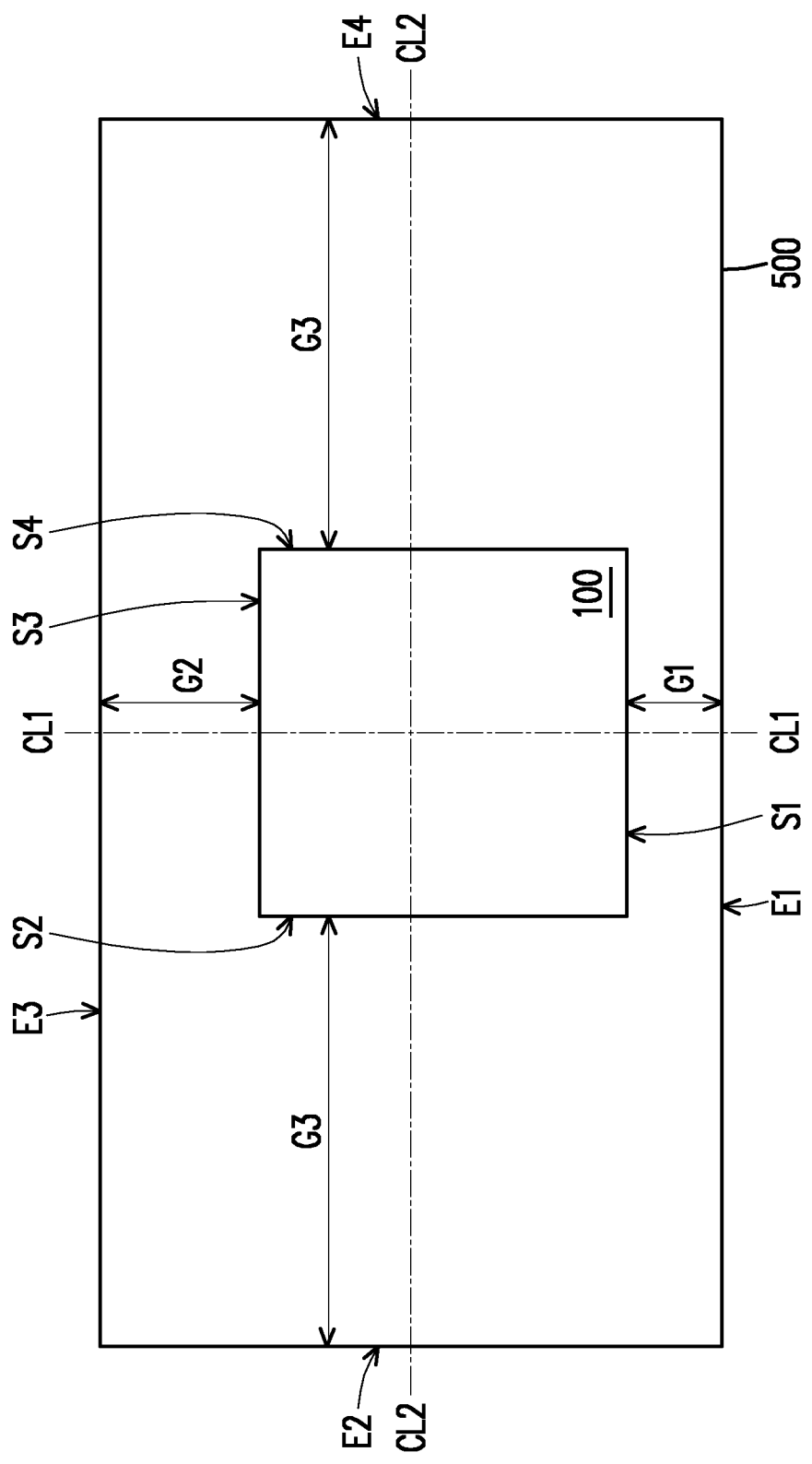
FIG. 2, FIG. 4 and FIG. 6 are schematic plane views illustrating a relative position of components included in the semiconductor package depicted in FIG. 1, FIG. 3 and FIG. 5, respectively.
Figure 3:
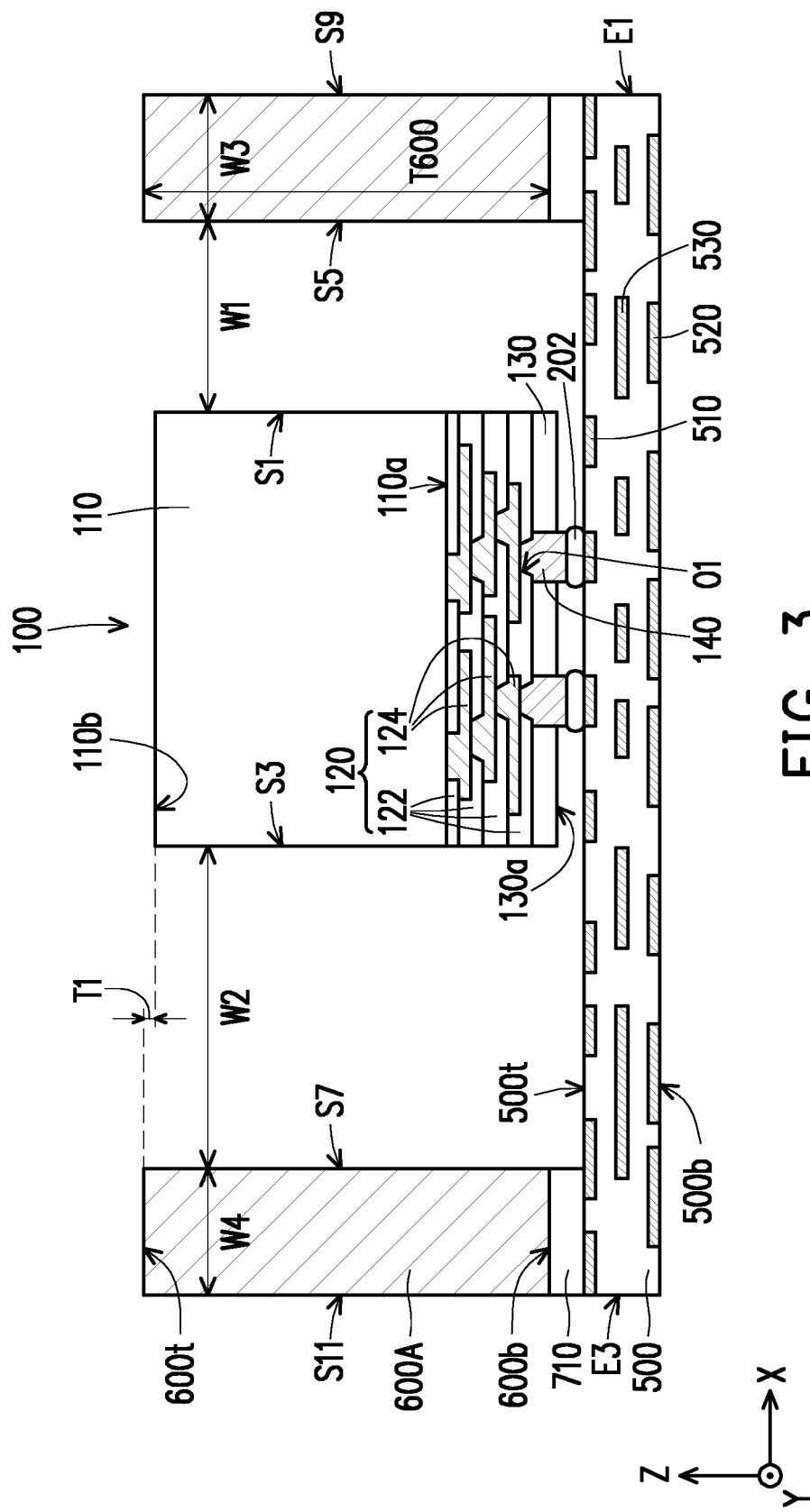
Figure 4:
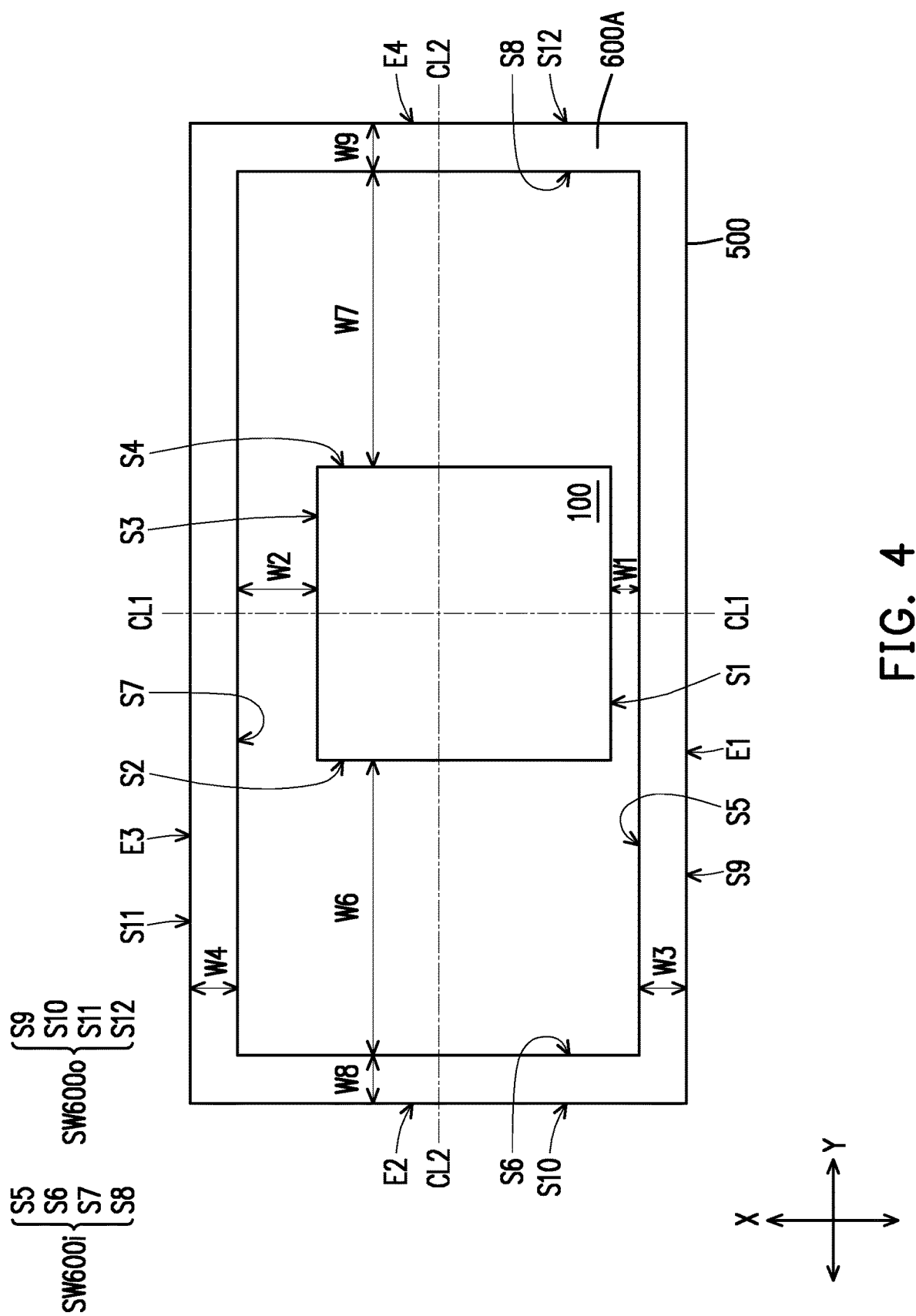
Figure 5:
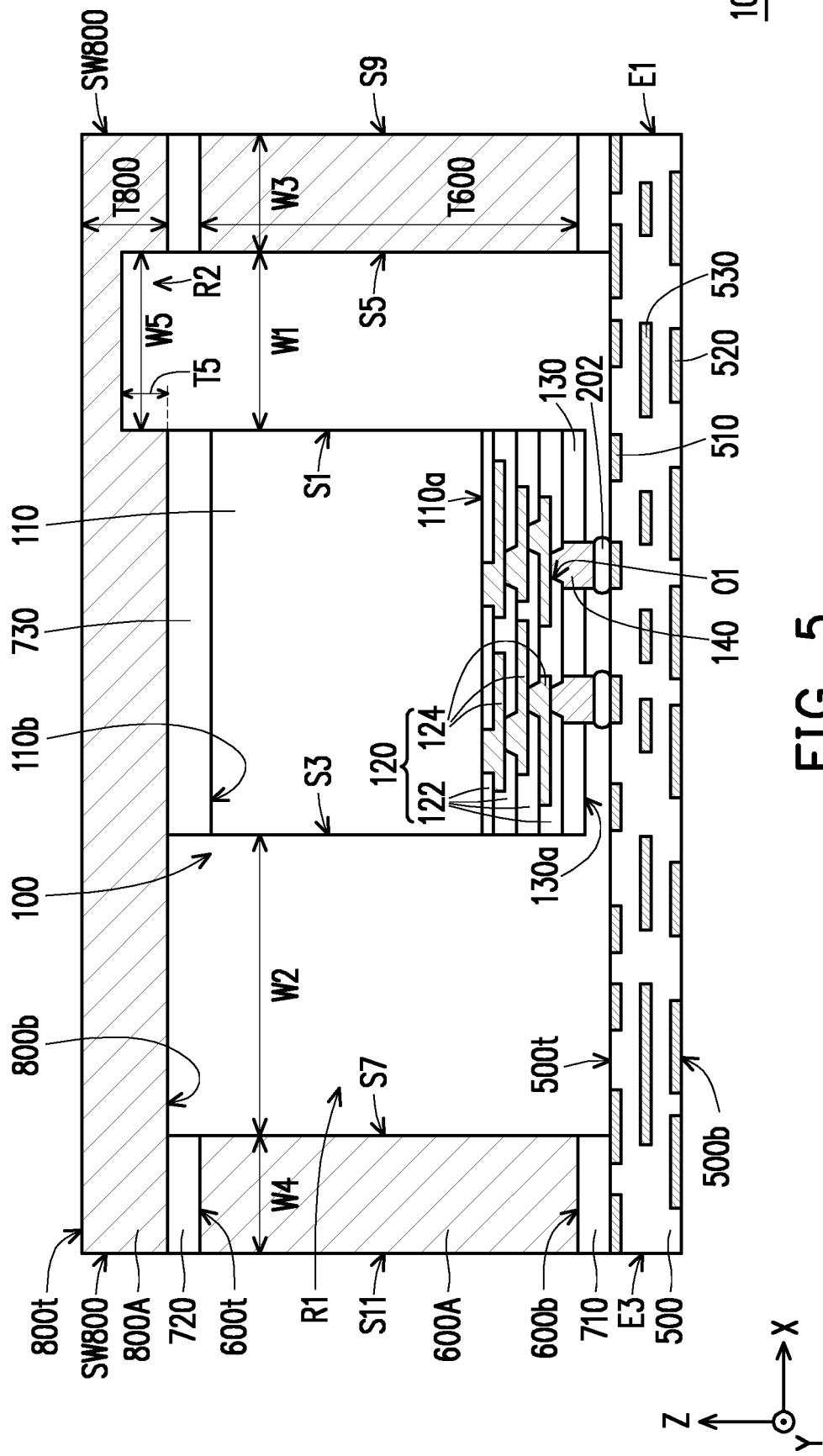
Figure 6:
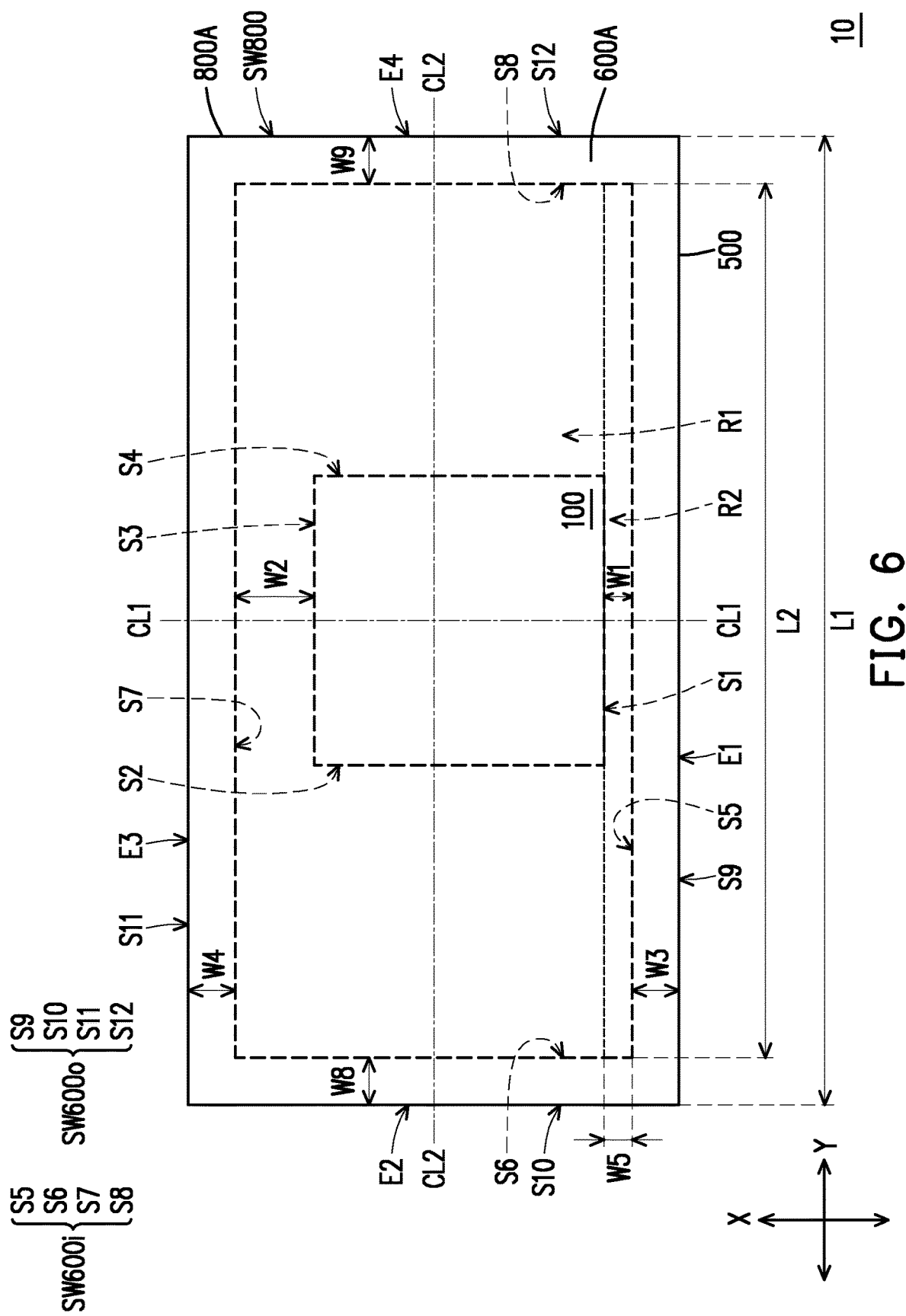
Figure 7:
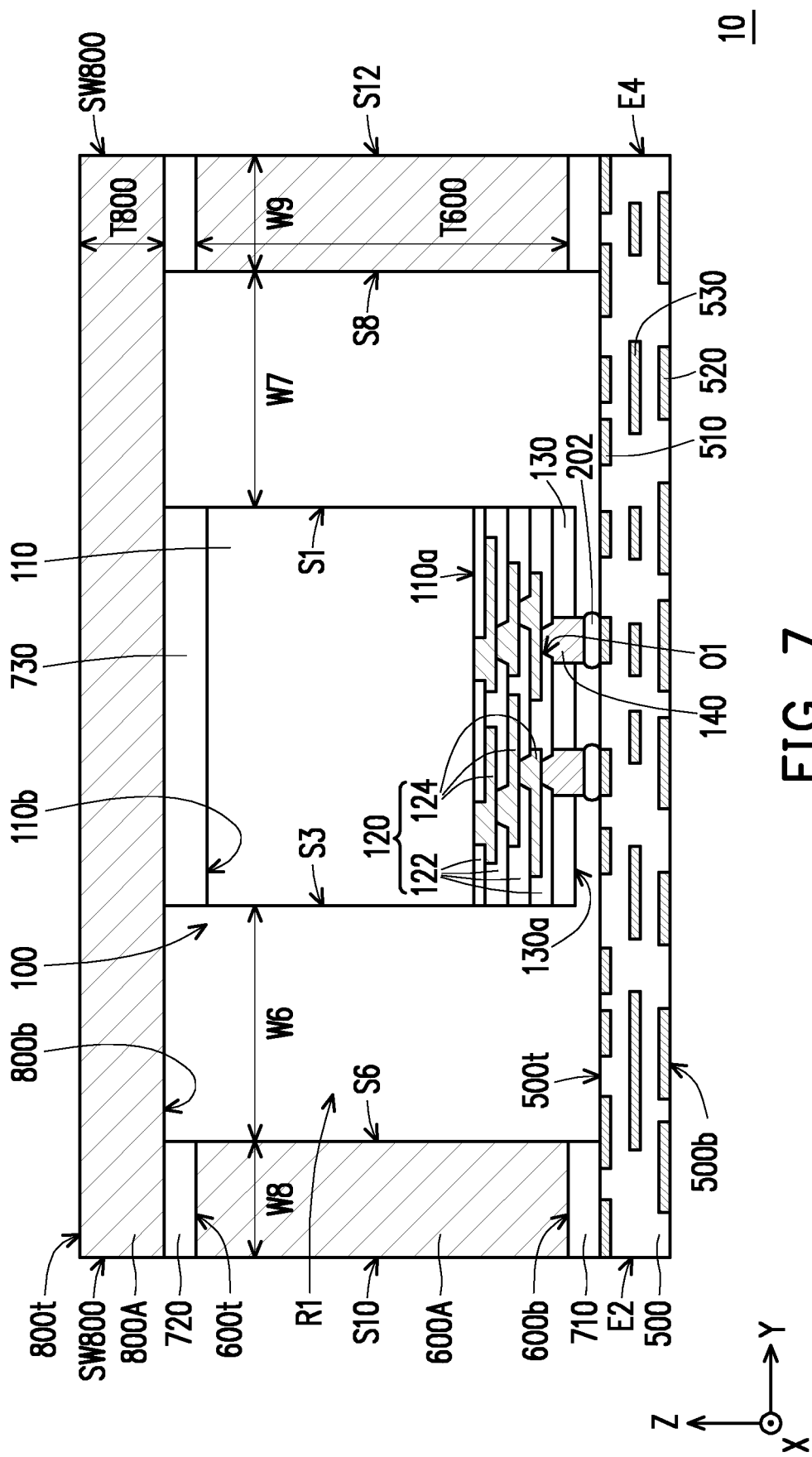
FIG. 7 is a schematic cross-sectional view showing the semiconductor package depicted in FIG. 6.
Figure 8:
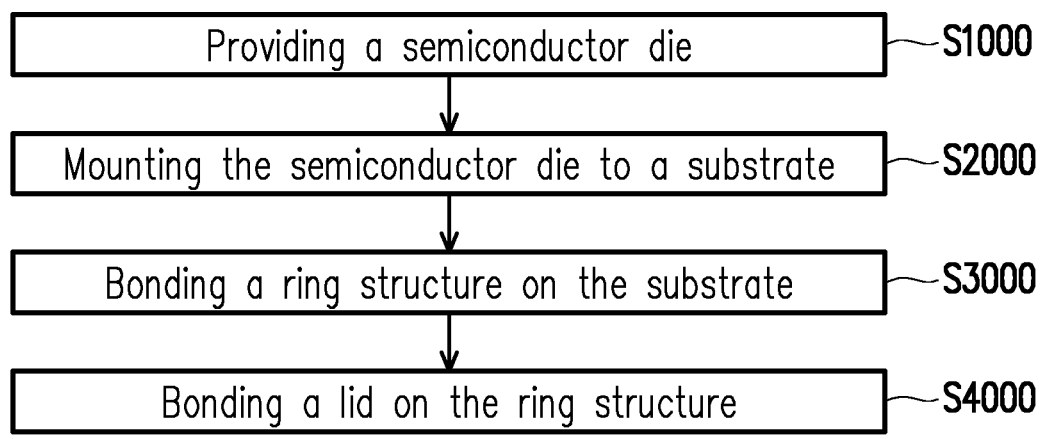
FIG. 8 is a flow chart illustrating a method of manufacturing a semiconductor package in accordance with some embodiments of the disclosure.
Figure 12:
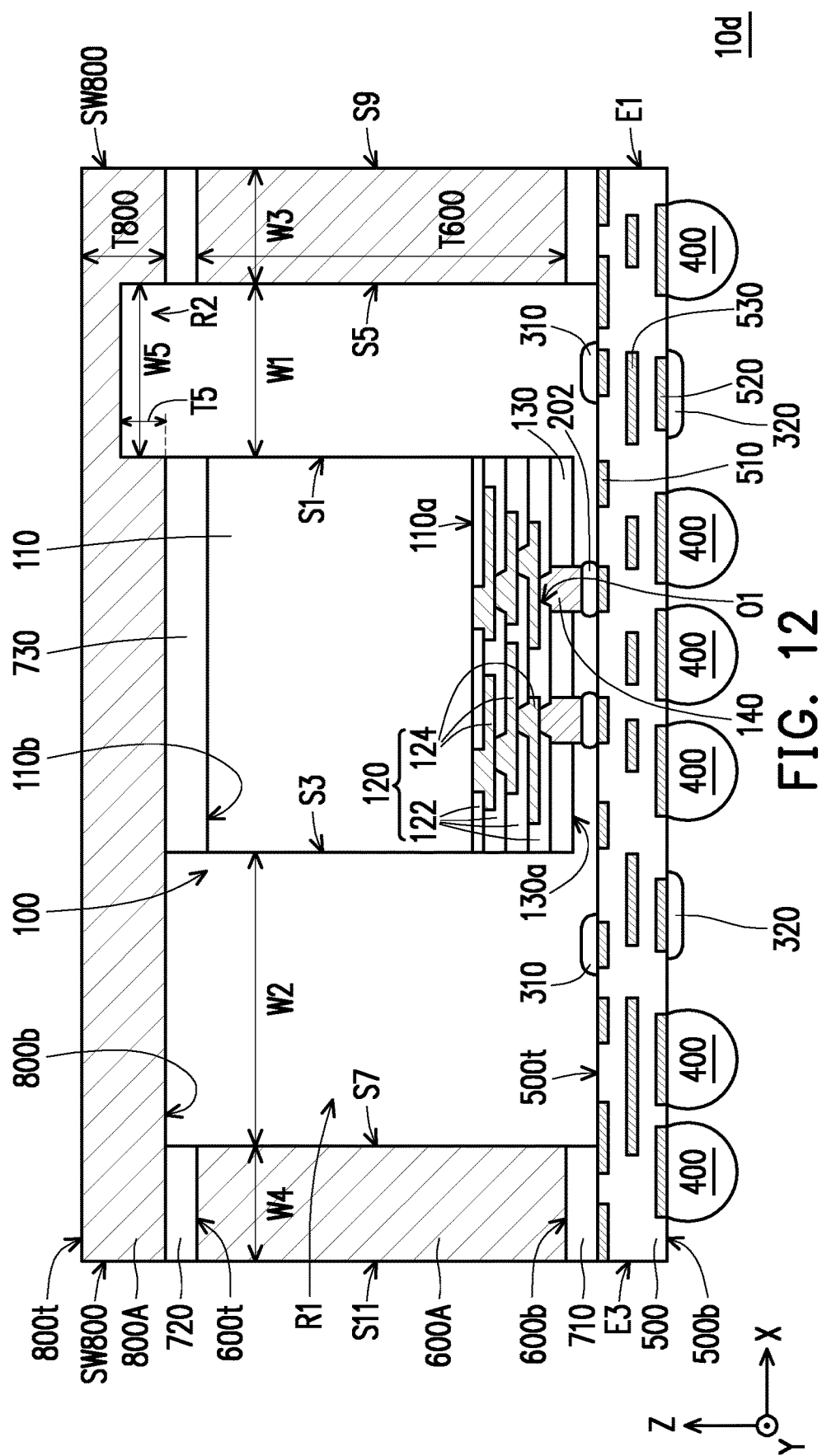
FIG. 12 is a schematic cross-sectional view showing a semiconductor package in accordance with some alternative embodiments of the disclosure.
Figure 13:
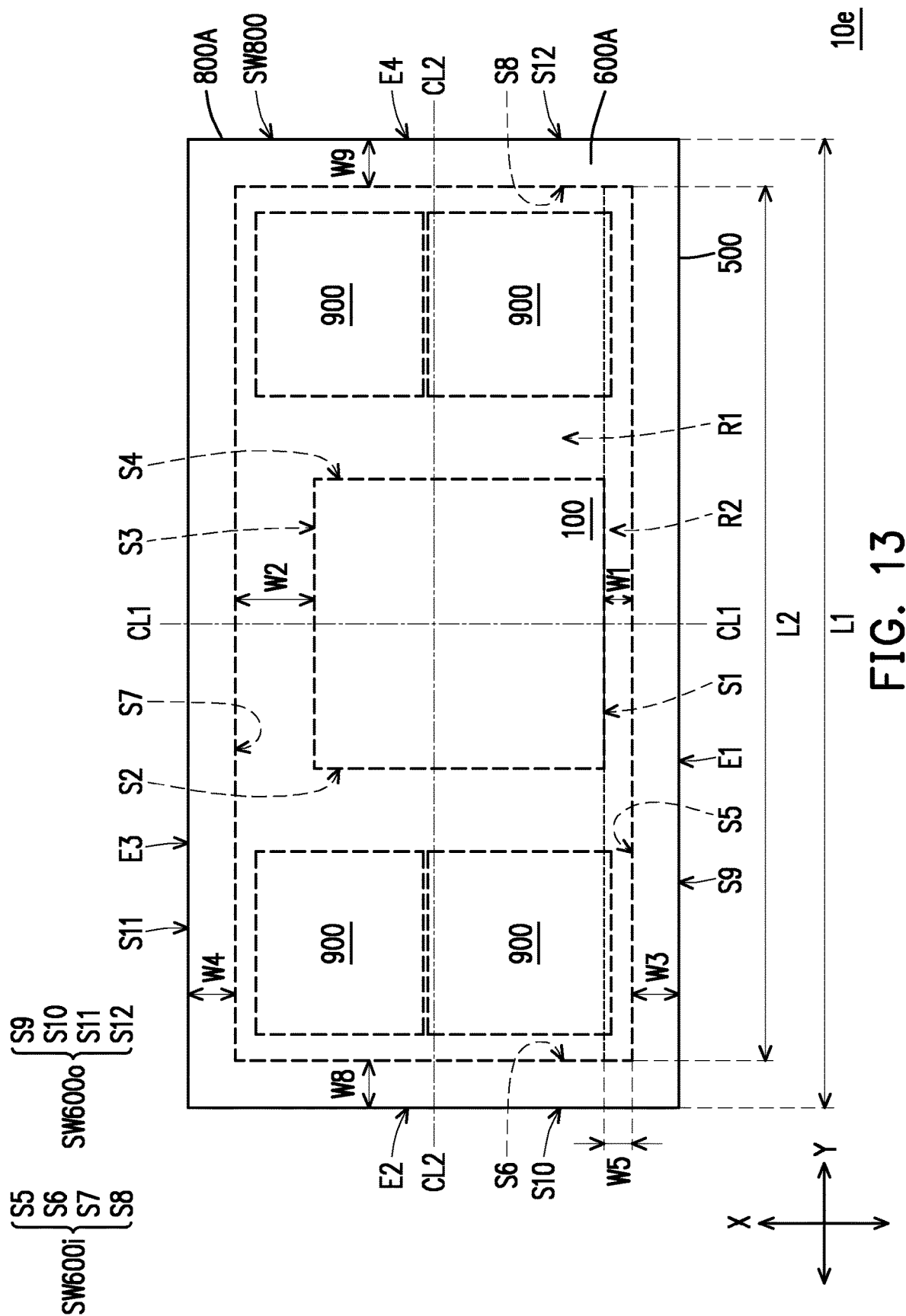
FIG. 13 is a schematic plane view illustrating a relative position of components included in a semiconductor package in accordance with some alternative embodiments of the disclosure.
Figure 14:
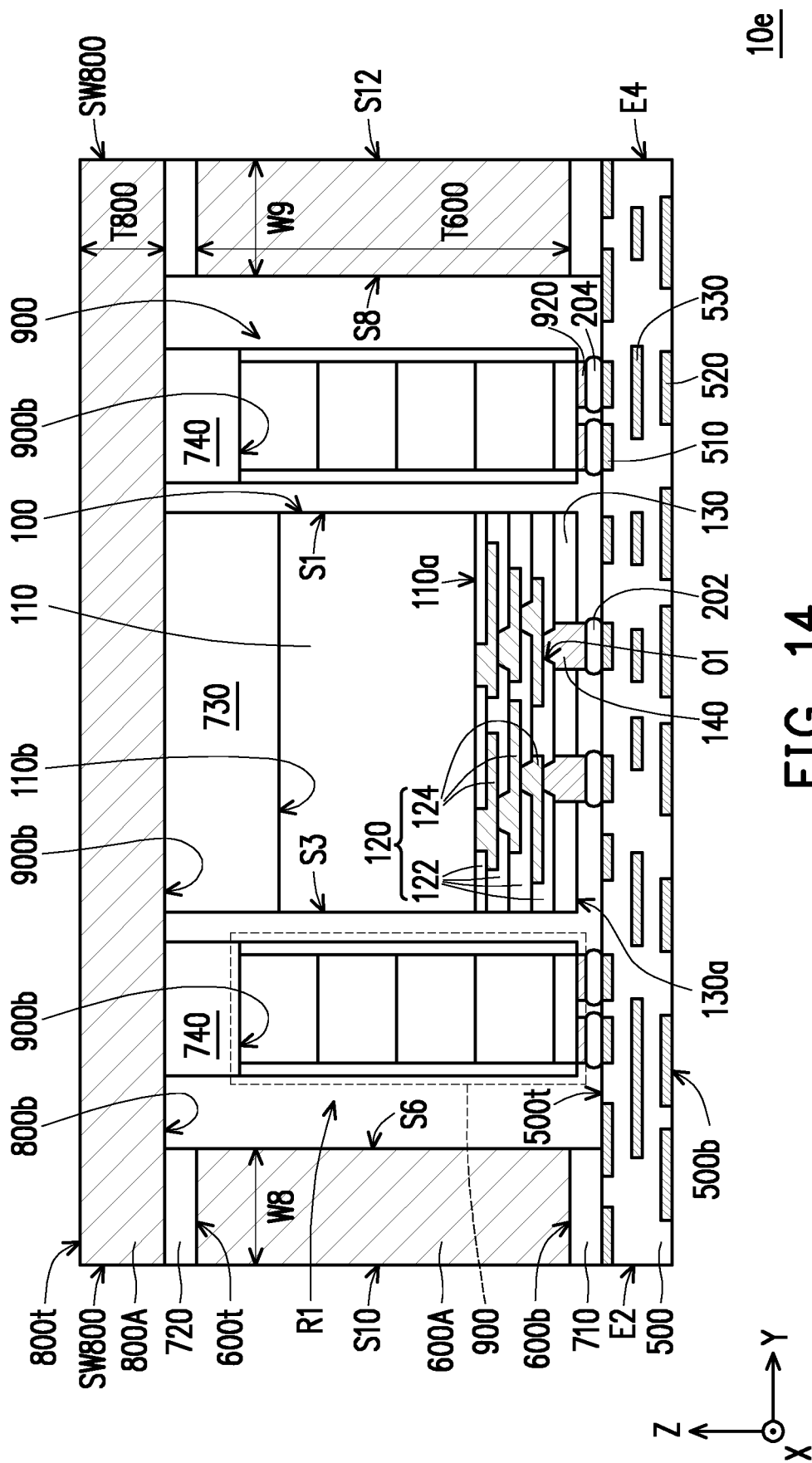
FIG. 14 is a schematic cross-sectional view showing the semiconductor package depicted in FIG. 13.

FIG. 1, FIG. 3 and FIG. 5 are schematic cross-sectional views showing a method of manufacturing a semiconductor package 10 in accordance with some embodiments of the disclosure. FIG. 2, FIG. 4 and FIG. 6 are schematic plane views illustrating a relative position of components included in the semiconductor package depicted in FIG. 1, FIG. 3 and FIG. 5, respectively. FIG. 7 is a schematic cross-sectional view showing the semiconductor package depicted in FIG. 6, where FIGS. 1, 3 and 5 are the cross-sectional views taken along a central line CL1 depicted in FIGS. 2, 4 and 6, and FIG. 7 is the cross-sectional view taken along a central line CL2 depicted in FIG. 6. FIG. 8 is a flow chart illustrating a method of manufacturing a semiconductor package in accordance with some embodiments of the disclosure. FIG. 9 through FIG. 12 and FIG. 14 are schematic cross-sectional view showing a semiconductor package in accordance with some alternative embodiments of the disclosure along the central line CL1. FIG. 13 is a schematic plane view illustrating a relative position of components included in the semiconductor package depicted in FIG. 14, where FIG. 14 is the cross-sectional view taken along the central line CL2 depicted in FIG. 13. In embodiments, the manufacturing method is part of a wafer level packaging process. It is to be noted that the process steps described herein cover a portion of the manufacturing processes used to fabricate a semiconductor package involving a semiconductor component such as a semiconductor die (or device/chip). The embodiments are intended to provide further explanations but are not used to limit the scope of the disclosure.

Referring to FIG. 1 and FIG. 2, in some embodiments, a semiconductor die 100 is provided, in accordance with a step S1000 of FIG. 8. In some embodiments, the semiconductor die 100 includes a semiconductor substrate 110, an interconnect structure 120 disposed on the semiconductor substrate 110, a passivation layer 130 disposed on the interconnect structure 120, and a plurality of conductive vias 140 penetrating through the passivation layer 130 and disposed on the interconnect structure 120. As shown in FIG. 1, the semiconductor substrate 110 has a frontside surface 110a and a backside surface 110b opposite to the frontside surface 110a, and the interconnect structure 120 is located on the frontside surface 110a of the semiconductor substrate 110, where the interconnect structure 120 is sandwiched between the semiconductor substrate 110 and the passivation layer 130 and sandwiched between the semiconductor substrate 110 and the conductive vias 140, for example.

In some embodiments, the semiconductor substrate 110 is a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components are formed in a front-end-of-line (FEOL) process. In an alternative embodiment, the semiconductor substrate 110 is a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

The semiconductor substrate 110 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, the semiconductor substrate 110 has an active surface (e.g., the frontside surface 110a), sometimes called a top side, and an inactive surface (e.g., the backside surface 110b), sometimes called a bottom side.

In some embodiments, the interconnect structure 120 includes one or more inter-dielectric layers 122 and one or more patterned conductive layers 124 stacked alternately. For examples, the inter-dielectric layers 122 are silicon oxide layers, silicon nitride layers, silicon oxy-nitride layers, or dielectric layers formed by other suitable dielectric materials, and are formed by deposition or the like. For examples, the patterned conductive layers 124 are patterned copper layers or other suitable patterned metal layers, and are formed by electroplating or deposition. However, the disclosure is not limited thereto. Alternatively, the patterned conductive layers 124 may be formed by dual-damascene method. The number of the inter-dielectric layers 122 and the number of the patterned conductive layers 124 may be less than or more than what is depicted in FIG. 1, and may be designated based on the demand and/or design layout; the disclosure is not specifically limited thereto. In some embodiments, the interconnect structure 120 is formed in a back-end-of-line (BEOL) process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, as shown in FIG. 1, the patterned conductive layers 124 are sandwiched between the inter-dielectric layers 122, where a surface of an illustrated topmost layer of the patterned conductive layers 124 is at least partially exposed by a plurality of openings (no marked) formed in an illustrated topmost layer of the inter-dielectric layers 122 and electrically connected to the active components and/or passive components included in the semiconductor substrate 110, and a surface of an illustrated bottommost layer of the patterned conductive layers 124 is at least partially exposed by a plurality of openings O1 formed in an illustrated bottommost layer of the inter-dielectric layers 122 and electrically connected to later formed component(s) for electrical connection (e.g. with the conductive vias 140). The shapes and numbers of the openings O1 and the shapes and numbers of the openings formed in the illustrated topmost layer of the inter-dielectric layers 122 are not limited in the disclosure, and may be designated based on the demand and/or design layout.

In some embodiments, as shown in FIG. 1, the passivation layer 130 is formed on the interconnect structure 120, where parts of the interconnect structure 120 is covered by and in contact with the passivation layer 130, and rest of the interconnect structure 120 is accessibly revealed by the passivation layer 130. As shown in FIG. 1, the passivation layer 130 has a surface 130*a*, which is substantially planar, for example. In certain embodiments, the surface 130*a* of the passivation layer 130 is leveled and may have a high degree of planarity and flatness, which is beneficial for the later-formed layers/elements (e.g. the conductive vias 140). In some embodiments, the passivation layer 130 includes a polyimide (PI) layer, a polybenzoxazole (PBO) layer, a silicon dioxide based (non-organic) layer or other suitable polymer (or organic) layer, and is formed by deposition or the like. The disclosure is not limited thereto. The disclosure does not specifically limit a thickness of the passivation layer 130 as long as the surface 130*a* of the passivation layer 130 can maintain its high degree of planarity and flatness. In the disclosure, the surface 130*a* of the passivation layer 130 may be referred to as a front surface of the semiconductor die 100, and the backside surface 110*b* of the semiconductor substrate 110 may be referred to as a backside surface of the semiconductor die 100.

In some embodiments, the conductive vias 140 are formed on the interconnect structure 120 and over the semiconductor substrate 110, and sidewalls of the conductive vias 140 are wrapped around by the passivation layer 130. In some embodiments, as shown in FIG. 1, the conductive vias 140 each penetrate through the passivation layer 130 and extend into the openings O1 formed in the illustrated bottommost layer of the inter-dielectric layers 122 to physically contact the surface of the illustrated bottommost layer of the patterned conductive layers 124 exposed by the openings O1. Through the interconnect structure 120, the conductive vias 140 are electrically connected to the active components and/or passive components included in the semiconductor substrate 110. In some embodiments, the conductive vias 140 in physical contact with the interconnect structure 120 are extended away from the surface 130*a* of the passivation layer 130, as shown in FIG. 1. However, the disclosure is not limited thereto; alternatively, the conductive vias 140 in physical contact with the interconnect structure 120 each may include a surface substantially coplanar to and leveled with the surface 130*a* of the passivation layer 130. Only two conductive vias 140 are presented in FIG. 1 for illustrative purposes and simplicity, however it should be noted that more than two conductive vias 140 may be included; the disclosure is not limited thereto.

In some embodiments, the conductive vias 140 are formed by photolithography, plating, photoresist stripping processes or any other suitable method. The plating process may include an electroplating, an electroless plating, or the like. For example, the conductive vias 140 is formed by, but not limited to, forming a mask pattern (not shown) covering the passivation layer 130 with openings (not shown) corresponding to the surface of the illustrated bottommost layer of the patterned conductive layers 124 exposed by the openings O1, patterning the passivation layer 130 to form contact openings (not shown) therein to expose the surface of the illustrated bottommost layer of the patterned conductive layers 124 exposed by the openings O1, forming a metallic material filling the openings formed in the mask pattern, the contact openings formed in the passivation layer 130 and the openings O1 to form the conductive vias 140 by electroplating or deposition, and then removing the mask pattern. The passivation layer 130 may be patterned by an etching process, such as a dry etching process, a wet etching process, or the combination thereof. It is noted that, for example, the contact openings formed in the passivation layer 130 each are spatially communicated to a respective one opening O1 overlying thereto for the formation of the conductive vias 140. The mask pattern may be removed by acceptable ashing process and/or photoresist stripping process, such as using an oxygen plasma or the like. In one embodiment, the material of the conductive vias 140 includes a metal material such as copper or copper alloys, or the like.

In some embodiments, in a vertical projection on the frontside surface 110*a* of the semiconductor substrate 110 along a stacking direction Z of the semiconductor substrate 110, the interconnect structure 120 and the passivation layer 130, the conductive vias 140 may, independently, be in a circle-shape, an ellipse-shape, a triangle-shape, a rectangle-shape, or the like. The shape of the conductive vias 140 is not limited in the disclosure. The number and shape of the conductive vias 140 may be designated and selected based on the demand, and adjusted by changing the number and shape of the contact openings formed in the passivation layer 130.

Alternatively, the conductive vias 140 may be formed by forming a first mask pattern (not shown) covering the passivation layer 130 with openings (not shown) corresponding to the surface of the illustrate bottommost layer of the patterned conductive layers 124 exposed by the openings O1, patterning the passivation layer 130 to form the contact openings (not shown) therein to expose the surface of the illustrate bottommost layer of the patterned conductive layers 124 exposed by the openings O1, removing the first mask pattern, conformally forming a metallic seed layer over the passivation layer 130, forming a second mask pattern (not shown) covering the metallic seed layer with openings (not shown) exposing the contact openings formed in the passivation layer 130 and the openings O1, forming a metallic material filling the openings formed in the second mask pattern, the contact openings formed in the passivation layer 130 and the openings O1 by electroplating or deposition, removing the second mask pattern, and then removing the metallic seed layer not covered by the metallic material to form the conductive vias 140. In some embodiments, the metallic seed layer is referred to as a metal layer, which includes a single layer or a composite layer comprising a plurality of sub-layers formed of different materials. In some embodiments, the metallic seed layer includes titanium, copper, molybdenum, tungsten, titanium nitride, titanium tungsten, combinations thereof, or the like. For example, the metallic seed layer may include a titanium layer and a copper layer over the titanium layer. The metallic seed layer may be formed using, for example, sputtering, physical vapor deposition (PVD) or the like.

In some embodiments, for the semiconductor die 100, a sidewall of the semiconductor substrate 110, a sidewall of the interconnect structure 120 and a sidewall of the passivation layer 130 are substantially aligned with each other in the direction Z. For example, illustrated outermost surfaces of the conductive vias 140 are protruding away from (e.g. not aligned with) the surface 130a of the passivation layer 130, as shown in FIG. 1. Alternatively, illustrated outermost surfaces of the conductive vias 140 may be substantially leveled to and coplanar with (e.g. aligned with) the surface 130a of the passivation layer 130.

As illustrated in FIG. 1 and FIG. 2, the sidewall of the semiconductor die 100 connects the surface 130a of the semiconductor die 100 and the backside surface 110b of the semiconductor die 100, for example. In some embodiments, if considering a shape of the semiconductor die 100 in a top view thereof (e.g. on a X-Y plane) is a rectangular shape (such as a square), the sidewall of the semiconductor die 100 includes a first side S1, a second side S2, a third side S3 and a fourth side S4, where the first side S1 is opposite to the third side S3 along a direction X, and the second side S2 is opposite to the fourth side S4 along a direction Y. The directions X and Y are different from the direction Z, where the direction X is different from the direction Y. For example, the direction X is perpendicular to the direction Y, and the directions X and Y are perpendicular to the direction Z. As shown in FIG. 2, an end of the first side S1 and an end of the third side S3 is connected by the second side S2, and other end of the first side S1 and other end of the third side S3 is connected by the fourth side S4, for example.

It is appreciated that, in some embodiments, the semiconductor die 100 described herein may be referred to as a semiconductor chip or an integrated circuit (IC). In some embodiments, the semiconductor die 100 is a logic chip, such as a central processing unit (CPU), a graphics processing unit (GPU), a system-on-a-chip (SoC), a system-on-integrated-circuit (SoIC), a microcontroller, or the like. However, the disclosure is not limited thereto; alternatively, the semiconductor die 100 may include a digital chip, an analog chip or a mixed signal chip, such as an application-specific integrated circuit ("ASIC") chip, a sensor chip, a wireless and radio frequency (RF) chip, a baseband (BB) chip, a memory chip (such as high bandwidth memory (HBM) dies) or a voltage regulator chip. In further alternative embodiments, the semiconductor die 100 can be a chip or an IC of combination-type, such as a WiFi chip simultaneously including both of a RF chip and a digital chip. The semiconductor die 100 is in a form of chip-size package, in some embodiments.

Continued on FIG. 1, in some embodiments, the semiconductor die 100 is placed over and mounted on a substrate 500, in accordance with a step S2000 of FIG. 8. For example, the semiconductor die 100 is picked and placed on the substrate 500, and then is bonded to the substrate 500. The substrate 500 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In some alternative embodiments, the substrate 500 is a SOI substrate, where the SOI substrate may include a layer of a semiconductor material such as epitaxial silicon, germanium, silicon germanium, SOI, silicon germanium on insulator (SGOI), or combinations thereof. In further alternative embodiments, the substrate 500 is based on an insulating core, such as a fiberglass reinforced resin core. One example core material is fiberglass resin such as flame-retardant class 4 (FR4). Alternatives for the core material may include bismaleimide triazine (BT) resin, or alternatively, other printed circuit board (PCB) materials or films. In yet further alternative embodiments, the substrate 500 is a build-up film such as Ajinomoto build-up film (ABF) or other suitable laminates.

In one embodiment, the substrate 500 includes active and/or passive devices (not shown), such as transistors, capacitors, resistors, combinations thereof, or the like which may be used to generate the structural and functional design for the semiconductor package. The active and/or passive devices may be formed using any suitable methods. However, the disclosure is not limited thereto; in an alternative embodiment, the substrate 500 is substantially free of active and/or passive devices.

In some embodiments, the substrate 500 includes a plurality of bonding pads 510, a plurality of bonding pads 520, a plurality of metallization layers 530 and vias (not shown) interconnecting the metallization layers 530, where the bonding pads 510, 520 are electrically connected to the metallization layers 530 and vias. The metallization layers 530 and vias together form a functional circuitry providing routing for the substrate 500. The metallization layers 530 and vias embedded in the substrate 500 may be formed of alternating layers of dielectric material (e.g., low-k dielectric material) and conductive material (e.g., copper) with vias interconnecting the layers of conductive material, and may be formed through any suitable process (such as deposition, damascene, dual damascene, or the like).

The bonding pads 510, 520 are used to provide electrical connection with external component(s) for the substrate 500. The bonding pads 510 and 520 may respectively disposed on two opposite sides of the substrate 500. In some embodiments, the bonding pads 510 are located on and distributed over an illustrated top surface 500*t* of the substrate 500, the bonding pads 520 are located on and distributed over an illustrated bottom surface 500*b* of the substrate 500. For example, as shown in FIG. 1, the illustrated top surface 500*t* is opposite to the illustrated bottom surface 500*b* along the direction Z. In some embodiments, some of the bonding pads 510 are electrically connected to the bonding pads 520 through the metallization layers 530 and vias. In some embodiments, some of the bonding pads 510 are electrically connected to some other of the bonding pads 510 through the metallization layers 530 and vias. In some embodiments, some of the bonding pads 520 are electrically connected to some other of the bonding pads 520 through the metallization layers 530 and vias. The disclosure is not limited thereto.

In the embodiments of which the conductive vias 140 are protruded from the passivation layer 130, the conductive vias 140 of the semiconductor die 100 are respectively connected to the bonding pads 510 of the substrate 500 through solder regions 202 by flip chip bonding, as shown in FIG. 1. In some embodiments, through the bonding pads 510, the conductive vias 140 and the solder regions 202 sandwiched therebetween, the semiconductor die 100 is mechanically and electrically connected to the substrate 500. In addition, the substrate 500 is considered as a circuit structure (e.g. an organic substrate with circuitry structure embedded therein, such as a PCB). The solder regions 202 may be pre-solder pastes. However, the disclosure is not limited thereto; alternatively, the solder regions 202 may be pre-solder blocks. In some embodiments, the material of the solder regions 202 may include a lead-free solder material (such as Sn—Ag base or Sn—Ag—Cu base materials) with or without additional impurity (such as Ni, Bi, Sb, Au, or the like). In some embodiments, an underfill (not shown) is formed on the substrate 500 to fill the gap between the semiconductor die 100 and the substrate 500, and wraps sidewalls of the solder regions 202 and the conductive vias 140. The underfill may be any acceptable material, such as a polymer, epoxy resin, molding underfill, or the like, for example. In one embodiment, the underfill may be formed by underfill dispensing, a capillary flow process, or any other suitable method.

Alternatively, in the embodiments of which the surfaces of the conductive vias 140 are substantially coplanar to the surface 130*a* of the passivation layer 130, the semiconductor die 100 is connected to the substrate 500 by hybrid bonding (involving a metal-to-metal bonding and a dielectric-to-dielectric bonding). The disclosure is not limited thereto.

As illustrated in FIG. 1 and FIG. 2, the substrate 500 has a sidewall connecting the illustrated top surface 500*t* of the substrate 500 and the illustrated bottom surface 500*b* of the substrate 500, for example. In some embodiments, if considering a shape of the substrate 500 in a top view thereof (e.g. on the X-Y plane) is a rectangular shape, the sidewall of the substrate 500 includes a first edge E1, a second edge E2, a third edge E3 and a fourth edge E4, where the first edge E1 is opposite to the third edge E3 along a direction X, and the second edge E2 is opposite to the fourth edge E4 along a direction Y. As shown in FIG. 2, an end of the first edge E1 and an end of the third edge E3 is connected by the second edge E2, and other end of the first edge E1 and other end of the third edge E3 is connected by the fourth edge E4, for example. In some embodiments, the central line CL1 is a central line of the substrate 500 which is substantially parallel to a short axis of the substrate 500, and the central line CL2 is a central line of the substrate 500 which is substantially parallel to a long axis of the substrate 500, as shown in FIG. 2. In other words, the central line CL1 is extending in the direction X and intersected to long sides (e.g. the first edge E1 and the third edge E3) of the substrate 500. On the other hand, the central line CL2 is extending in the direction Y and intersected to short sides (e.g. the second edge E2 and the fourth edge E4) of the substrate 500. In the disclosure, the direction X may be referred to as an extending direction of the second edge E2 and the fourth edge E4, while the direction Y may be referred to as an extending direction of the first edge E1 and the third edge E3.

In the disclosure, the semiconductor die 100 is bonded to the substrate 500 in an offset position. For example, the semiconductor die 100 is shifted from the central line CL2 toward the first edge E1 of the substrate 500, where the first side S1 of the semiconductor die 100 is distant from the first edge E1 by a gap G1, as shown in FIG. 1 and FIG. 2. As shown in FIG. 2, the first side S1 of the semiconductor die 100 is offset from the first edge E1 of the substrate 500 by the gap G1, where the gap G1 is less than a gap G2 between the second side S2 of the semiconductor die 100 and the second edge E2 of the substrate 500, in some embodiments. That is, the central line CL2 is not considered as a central line of the semiconductor die 100 in the direction Y, due to the central line CL2 does not pass through the median of a length of the second side S2 and/or the fourth side S4 of the semiconductor die 100. In other words, the semiconductor die 100 is bonded to the substrate 500 in the offset position (e.g. eccentric with the gap G1 from the edge (e.g. the first edge E1) of the substrate 500), along the direction X.

On the other hand, along the direction Y, the sides (e.g. the second side S2 and the fourth side S4) of the semiconductor die 100 are respectively distant from the edges (e.g. the second edge E2 and the fourth edge E4) of the substrate 500 with an equal distance, such as a gap G3. That is, the central line CL1 is further considered as a central line of the semiconductor die 100 in the direction X, due to the central line CL1 passes through the median of a length of the first side S1 and/or the third side S3 of the semiconductor die 100. In some embodiments, the gap G3 is greater than the gap G2 and the gap G1, and the gap G2 is greater than the gap G1, as shown in FIG. 2. In alternative embodiments, the gap G3 is less than the gap G2 and the gap G1, while the gap G2 is greater than the gap G1. In further alternative embodiments, the gap G3 may be substantially equal to the gap G2 or the gap G1, and the gap G2 is greater than the gap G1. The disclosure is not limited thereto.

Referring to FIG. 3 and FIG. 4, in some embodiments, a ring structure 600A is provided and then bonded to the substrate 500, in accordance with a step S3000 of FIG. 8. For example, a bottom surface 600*b* of the ring structure 600A is adhered to the illustrated top surface 500*t* of the substrate 500 through an adhesive 710, where the ring structure 600A surrounds the semiconductor die 100. In some embodiments, in the top view (e.g., the X-Y plane), the ring structure 600A is in a form of a full (continuous) frame annulus having an inner sidewall SW600*i* facing the sidewall of the semiconductor die 100 and an outer sidewall SW600*o* opposite to the inner sidewall SW600*i*, where the outer sidewall SW600*o* is substantially aligned with the sidewall of the substrate 500 in the direction Z. For example, as shown in FIG. 3, the inner sidewall SW600*i* and the outer sidewall SW600*o* of the ring structure 600A each are a substantially continuous vertical sidewall.

In the top view, the ring structure 600A may have an annulus shape corresponding to the contour of the substrate 500. In some embodiments, the ring structure 600A has a rectangular annulus shape in the top view with two opposite long sides and two opposite short sides, where the central line CL1 is intersected with the long sides of the ring structure 600A and the central line CL2 is intersected with the short sides of the ring structure 600A. For example, as shown in FIG. 3 and FIG. 4, the inner sidewall SW600i of the ring structure 600A includes four sides S5-S8, where the (long) side S5 is opposite to the (long) side S7 in the direction X, the (short) side S6 is opposite to the (short) side S8 in the direction Y. Similarly, the outer sidewall SW600o of the ring structure 600A includes four sides S9-S12, where the (long) side S9 is opposite to the (long) side S11 in the direction X, the (short) side S10 is opposite to the (short) side S12 in the direction Y, for example.

For example, as shown in FIG. 3 and FIG. 4, the inner sidewall SW600i (e.g. S5) of the ring structure 600A is distant from the first side S1 of the semiconductor die 100 by a gap W1, the inner sidewall SW600i (e.g. S7) of the ring structure 600A is distant from the third side S3 of the semiconductor die 100 by a gap W2, the inner sidewall SW600i (e.g. S6) of the ring structure 600A is distant from the second side S2 of the semiconductor die 100 by a gap W6, and the inner sidewall SW600i (e.g. S8) of the ring structure 600A is distant from the fourth side S4 of the semiconductor die 100 by a gap W7, where the gap W2 is greater than the gap W1, and the gap W6 is substantially equal to the gap W7. In other words, corresponding to the offset position of the semiconductor die 100 being located on the substrate 500, the semiconductor die 100 is arranged in an eccentric manner with the gap W1 in respect with the ring structure 600A in the direction X. In the disclosure, the gap W1 may be referred to as an offset position of the semiconductor die 100 to the semiconductor package.

Figure 9:
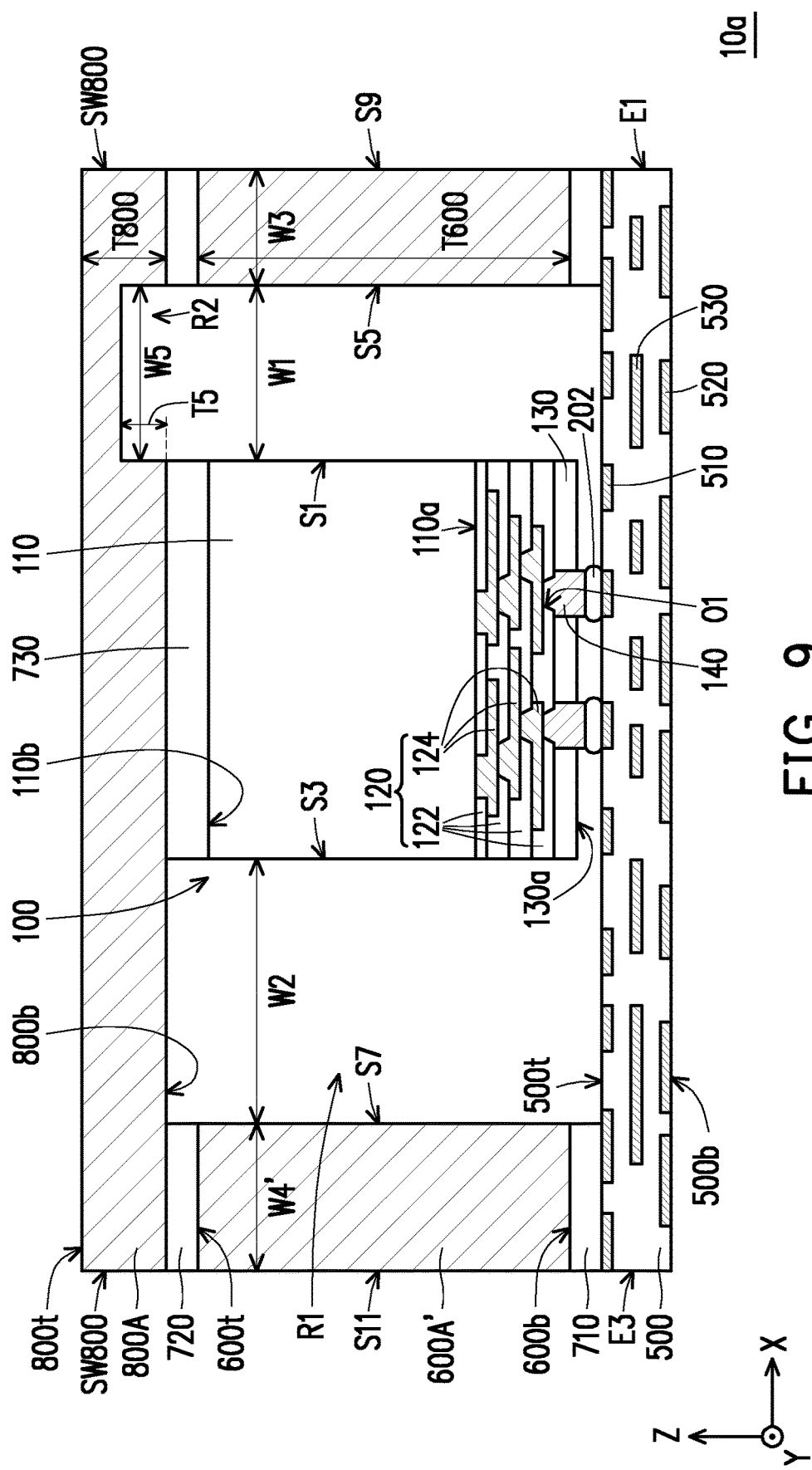
FIG. 9 is a schematic cross-sectional view showing a semiconductor package in accordance with some alternative embodiments of the disclosure.
Figure 10:
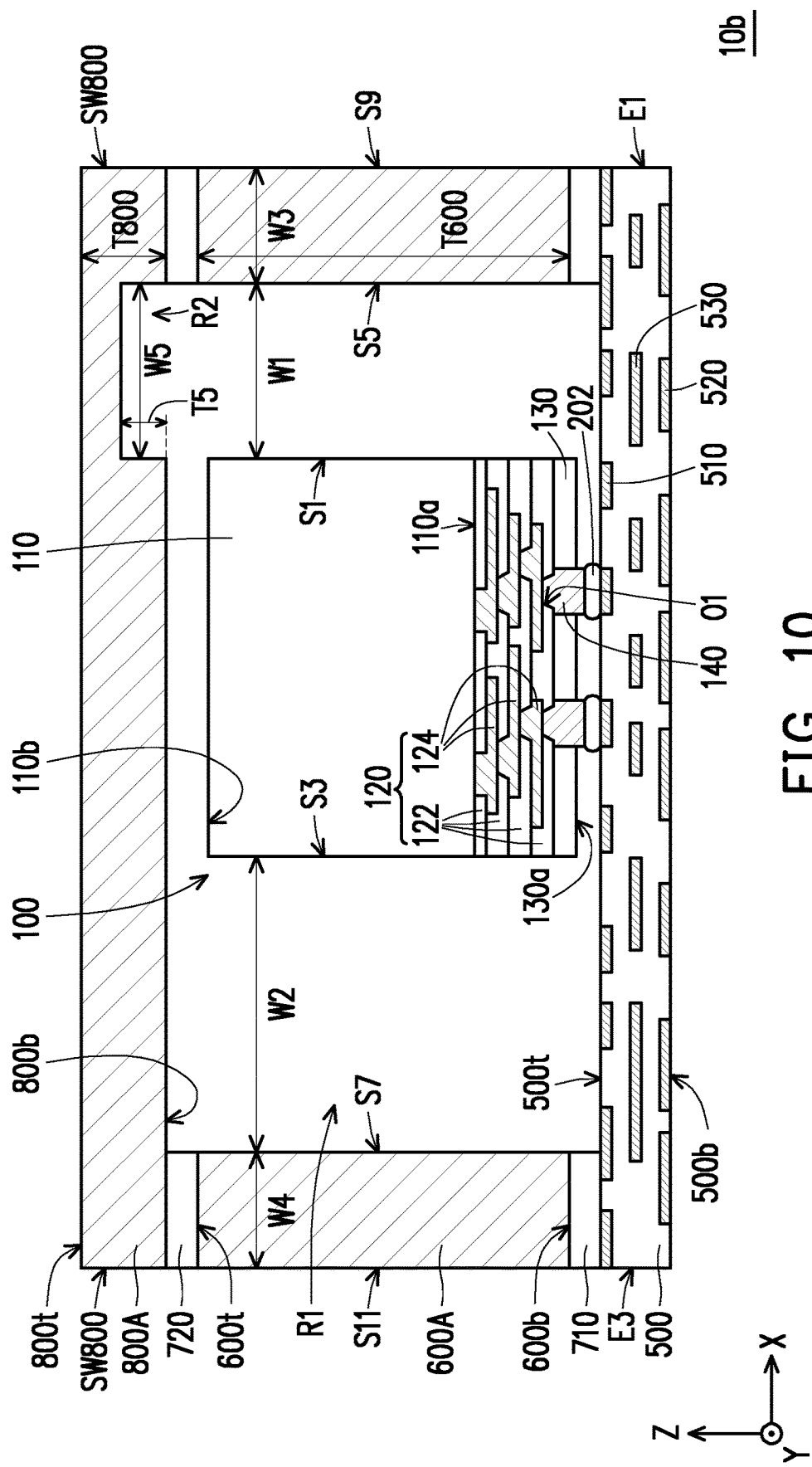
FIG. 10 is a schematic cross-sectional view showing a semiconductor package in accordance with some alternative embodiments of the disclosure.
Figure 11:
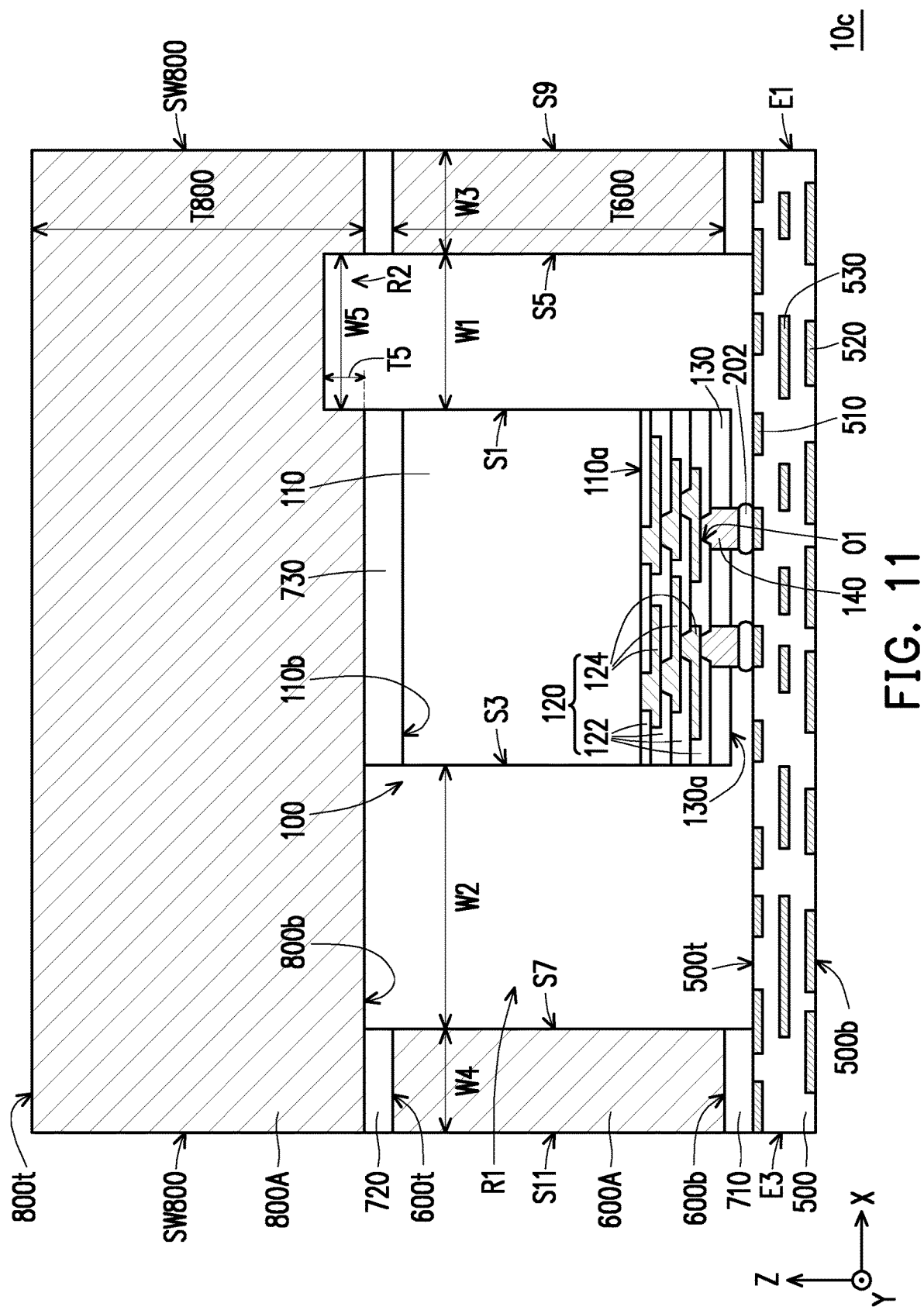
FIG. 11 is a schematic cross-sectional view showing a semiconductor package in accordance with some alternative embodiments of the disclosure.

The ring structure 600A may have a substantially identical thickness in the top view. For example, as shown in the top view of FIG. 4, where a thickness W3 between the sides S5 and S9 in an extending direction (e.g. X) of the central line CL1, a thickness W4 between the sides S7 and S11 in the extending direction (e.g. X) of the central line CL1, a thickness W8 between the sides S6 and S10 in an extending direction (e.g. Y) of the central line CL2 and a thickness W9 between the sides S8 and S12 in the extending direction (e.g. Y) of the central line CL2 are substantially identical. However, the disclosure is not limited thereto; as long as the gap W2 is greater than the gap W1 and the gaps W6 and W7 are substantially identical, the thicknesses W3, W4, W8 and W9 may be different from or equal to the each other. For example, the thickness W3 may be different from the thickness W4. In some embodiments, a semiconductor package 10a of FIG. 9 and the semiconductor package 10 of FIG. 5 are similar; the difference is that, the ring structure 600A is substituted with a ring structure 600A', where the ring structure 600A' has non-uniform thickness in a top view. In the ring structure 600A', the thickness W4' may be different from the thicknesses W3, W8 and W9. For example, the thickness W4' is greater than the thickness W3 as shown in FIG. 9, while the thicknesses W3, W8 and W9 are identical (not shown). In alternative embodiments, the thickness W4 is less than the thickness W3 (not shown) while the thicknesses W3, W8 and W9 are identical. Or, the thickness W3 may be greater than, less than or substantially equal to the thickness W4, while the thicknesses W4, W8 and W9 may be identical.

In some embodiments, a material of the ring structure 600A includes an electrically conductive material, a thermally conductive material or an electrically and thermally conductive material. In some embodiments, the material of the ring structure 600A includes metals or metal alloys, such as copper, aluminum, their alloys, combinations thereof or the like. In some embodiments, the adhesive 710 includes an electrically conductive adhesive, a thermally conductive adhesive or an electrically and thermally conductive adhesive. The adhesive 710 may further include a filler. For example, the filler includes a metal filler or a metal alloy filler. Through the adhesive 710, the ring structure 600A is electrically and thermally connected to the substrate 500. As shown in FIG. 3, in some embodiments, after the ring structure 600A is mounted onto the substrate 500, an illustrated top surface (e.g. 110b) of the semiconductor die 100 is lower than a top surface 600t of the ring structure 600 by a distance T1, where the top surface 600t is opposite to the bottom surface 600b in the direction Z.

Referring to FIG. 5 and FIG. 6, in some embodiments, a lid 800A is provided and then bonded to the ring structure 600A, in accordance with a step S4000 of FIG. 8. For example, a bottom surface 800b of the lid 800A is adhered to the top surface 600t of the ring structure 600A through an adhesive 720, where the lid 800A, the adhesive 720, the ring structure 600A, the adhesive 710 and the substrate 500 together confine a recess R1 enclosing the semiconductor die 100. In the disclosure, the recess R1 is referred to as an accommodating space for accommodating the semiconductor die 100. In some embodiments, in the top view (e.g., the X-Y plane), the lid 800A is in a form of a solid block having the sidewall substantially aligned with the sidewall of the substrate 500 in the direction Z as shown in FIG. 6 in conjunction with FIG. 5 and FIG. 7. That is, for example, a sidewall of the lid 800A is substantially aligned with the outer sidewall SW600o of the ring structure 600A and the sidewall of the substrate 500 in the direction Z, as shown in FIGS. 5-7. Up to here, the semiconductor package 10 is manufactured.

In some embodiments, the lid 800A includes a recess R2, where the recess R2 is spatially communicated with the recess R1. For example, the recess R2 has an opening (not labeled) at the bottom surface 800b of the lid 800A, where a sidewall of the recess R2 extends from the opening into the lid 800A along the direction Z. In some embodiments, as shown in FIG. 5, a thickness T5 of the recess R2 is greater than 0 and is less than or substantially equal to a thickness T800 of the lid 800A, as measured along the direction Z. For example, the thickness T5 of the recess R2 is greater than 0 and is less than or substantially equal to half of the thickness T800 of the lid 800A. In other words, the recess R2 is not penetrated through the lid 800A.

In some embodiments, the recess R2 is overlapped with the offset position (e.g. the gap W1) in a vertical projection on the substrate 500 along the direction Z as shown in FIG. 5 and FIG. 6. In some embodiments, the recess R2 is extended from the first side S1 towards the sidewall SW800 of the lid 800A, where a portion of the sidewall of the recess R2 is substantially aligned with the first side S1 of the semiconductor die 100, and a portion of the sidewall of the recess R2 is substantially aligned with the side S5 of the ring structure 600A. That is, a positioning location of the recess R2 is next to and between a positioning location of the semiconductor die 100 and a positioning location of the ring structure 600A in the vertical projection along direction Z. For example, in the top view of FIG. 6, the recess R2 has a length L2 less than a length L1 of the lid 800A and a width W5 greater than 0. In some embodiments, the width W5 is substantially equal to the offset position (e.g. the gap W1), as shown in FIG. 5 and FIG. 6. However, the disclosure is not limited thereto; alternatively, the width W5 may be greater than 0 and less than the offset position (e.g. the gap W1). Or alternatively, the width W5 may be greater than the offset position (e.g. the gap W1). In other words, for example, the recess R2 is located between the sidewall (e.g. S1) of the semiconductor die 100 and the sidewall SW800 of the lid 800A to overlap with the gap W1, as shown in FIGS. 5-7. Owing to such recess R2, more flexibility in deformation ability of the lid 800A at a location of the recess R2 is allowed, so as to avoid, suppress or reduce stress concentration and/or delamination issues caused by a stress induced by CTE mismatch and/or modulus mismatch at the adhesive between two components (e.g., between the lid 800A and the ring structure 600A and/or between the ring structure 600A and the substrate 500). In experimental perspective, the stress in the adhesive 720 is reduced about 13% to 20% compared to a conventional lid without a recess corresponding to the offset position.

The recess R2 may be formed in the lid 800A by, but not limited to, milling machining, laser techniques, etch techniques, a combination thereof, and/or the like; the disclosure is not limited thereto. In some embodiments, as shown in the top view of FIG. 6, the shape of the recess R2 is rectangular; however the disclosure is not limited thereto. Alternatively, in the top view, the shape of the recess R2 may be elliptical, oval, tetragonal, octagonal or any suitable polygonal shape.

The lid 800A may be referred to as the heat dissipating element of the semiconductor package 10. Alternatively, the lid 800A, the ring structure 600A and the adhesive 720 therebetween together may be referred to as the heat dissipating element of the semiconductor package 10. Owing to such heat dissipating element, the heat dissipation of the semiconductor die 100 in the semiconductor package 10 is improved. In addition, the thermal interface material may be coated on the semiconductor die 100 to facilitate the heat dissipation of the semiconductor package 10. As illustrated in the semiconductor package 10 of FIG. 5 and FIG. 7, a thermal interface material 730 is located between the backside surface 110b of the semiconductor die 100 and the bottom surface 800b of the lid 800A to thermally couple the semiconductor die 100 to the lid 800A, which further helps to dissipate heat from the semiconductor die 100 to the lid 800A. The thermal interface material 730 may include any suitable thermally conductive material such as a polymer having a good thermal conductivity, which may be between about 3 W/(m·K) to about 10 W/(m·K) or more, and may be formed on the backside surface 110b of the semiconductor die 100 by liquid dispensing. In some embodiments, the thermal interface material 730 is a film type thermal interface material, such as graphene sheet, carbon nanotube sheet or the like, and is formed on the backside surface 110b of the semiconductor die 100 by lamination or the like. The disclosure does not specifically limit a thickness of the thermal interface material 730 as long as the thermal interface material 730 is thick enough to sufficiently dissipating heat from the semiconductor die 100 to the lid 800A.

However, the disclosure is not limited thereto; alternatively, the thermal interface material 730 may be omitted. In some embodiments, a semiconductor package 10b of FIG. 10 and the semiconductor package 10 of FIG. 5 are similar; the difference is that, the thermal interface material 730 is removed, where the lid 800A is separated apart from (the backside surface 110b of) the semiconductor die 100 by a gap, such as an air gap.

In some embodiments, a material of the lid 800A includes an electrically conductive material, a thermally conductive material or an electrically and thermally conductive material. In some embodiments, the material of the lid 800A includes metals or metal alloys, such as copper, aluminum, their alloys, combinations thereof or the like. In some embodiments, the adhesive 720 includes an electrically conductive adhesive, a thermally conductive adhesive or an electrically and thermally conductive adhesive. The adhesive 720 may further include a filler. For example, the filler includes a metal filler or a metal alloy filler. The material of the adhesive 710 may be the same to the material of the adhesive 720. Alternatively, the material of the adhesive 710 may be the different from the material of the adhesive 720. In addition, the material of the ring structure 600A may be the same to the material of the lid 800A. Alternatively, the material of the ring structure 600A may be the different from the material of the lid 800A. Through the adhesive 720, the lid 800A is electrically and thermally connected to the ring structure 600A, and is further electrically and thermally connected to the substrate 500 through the ring structure 600A and the adhesive 710. In some embodiments, the lid 800A, the adhesive 720, the ring structure 600A and the adhesive 710 together constitute an electromagnetic interference (EMI) shielding structure (which is electrically connected to the substrate 500) for the semiconductor die 100. Owing to such EMI shielding structure, the impact causing by electromagnetic wave generated from other electronic elements located outside the semiconductor package 10 can be suppressed, thereby enhancing reliability and performance of the semiconductor package 10.

As illustrated in the semiconductor package 10 of FIG. 5, in some embodiments, a thickness T600 of the ring structure 600A is greater than the thickness T800 of the lid 800A, as measured along the direction Z. However, the disclosure is not limited thereto. For example, a semiconductor package 10c of FIG. 11 and the semiconductor package 10 of FIG. 5 are similar; the difference is that, the thickness T600 of the ring structure 600A is substantially equal to the thickness T800 of the lid 800A, as measured along the direction Z. Alternatively, the thickness T600 of the ring structure 600A may be less than the thickness T800 of the lid 800A, as measured along the direction Z.

In alternative embodiments, additional semiconductor devices and/or additional conductive terminals may be adopted. For example, a semiconductor package 10d of FIG. 12 and the semiconductor package 10 of FIG. 5 are similar; the difference is that, the semiconductor package 10d further includes semiconductor devices 310, 320 and a plurality of conductive terminals 400. As shown in the semiconductor package 10d of FIG. 12, the semiconductor devices 310 are disposed on the illustrate top surface 500t of the substrate 500 and next the semiconductor die 100 along the along the central line CL1, the semiconductor devices 320 are disposed on the illustrate bottom surface 500b of the substrate 500, and the conductive terminals 400 are disposed on the illustrate bottom surface 500b of the substrate 500 and next to the semiconductor devices 320. In some embodiments, some of the conductive terminals 400 are electrically connected to the semiconductor die 100 through the substrate 500, some of the conductive terminals 400 are electrically connected to the semiconductor devices 310, and some of the conductive terminals 400 are electrically connected to the semiconductor devices 320.

The semiconductor devices 310, 320 may be referred to as surface devices used to provide additional functionality or programming to the semiconductor die 100. For example, the semiconductor devices 310, 320 include surface mount devices (SMDs) or an integrated passive devices (IPDs) that comprise passive devices such as resistors, inductors, capacitors, jumpers, combinations of these, or the like that are desired to be connected to and utilized in conjunction with the semiconductor die 100. As shown in FIG. 12, the semiconductor devices 310, 320 are electrically connected to the semiconductor die 100 through the bonding pads 510, 520, the metallization layers 530 and vias, the solder regions 202 and the conductive vias 140, for example. The number of the semiconductor devices 310 and the number of the semiconductor devices 320 are not limited to the embodiment, and may be selected based on the demand and design layout.

The conductive terminals 400 may be used to physically and electrically connect the substrate 500 to other devices, packages, connecting components, and the like. The conductive terminals 400 are referred to as conductive connectors of the substrate 500 (serving as conductive input/output terminals of the semiconductor package 10*d*) for providing physical and/or electrical connection to external components, in the disclosure. For example, the conductive terminals 400 and the semiconductor die 100 are respectively located on two opposite sides of the substrate 500, where some of the conductive terminals 400 are electrically connected to the semiconductor die 100 through the bonding pads 520, the metallization layers 530 and vias, the bonding pads 510, the solder regions 202 and the conductive vias 140. The number of the conductive terminals 400 is not limited to the embodiment, and may be selected based on the demand and design layout. The conductive terminals 400 may be micro-bumps, metal pillars, electroless nickel-electroless palladium-immersion gold (ENEPIG) formed bumps, controlled collapse chip connection (C4) bumps (for example, which may have, but not limited to, a size of about 80 μm), a ball grid array (BGA) bumps or balls (for example, which may have, but not limited to, a size of about 400 μm), solder balls, or the like. The disclosure is not limited thereto. When solder is used, the solder may include either eutectic solder or non-eutectic solder. The solder may include lead or be lead-free, and may include Sn—Ag, Sn—Cu, Sn—Ag—Cu, or the like.

The disclosure is not limited thereto. In one embodiment, only semiconductor devices 310 are formed on the substrate 500, where the number of the semiconductor devices 310 may be one or more than one. In an alternative embodiment, only semiconductor devices 320 are formed on the substrate 500, where the number of the semiconductor devices 320 may be one or more than one. In a further alternative embodiment, only conductive terminals 400 are formed on the substrate 500.

In alternative embodiments, additional semiconductor dies may be adopted. For example, a semiconductor package 10*e* of FIG. 13 and FIG. 14 and the semiconductor package 10 of FIG. 5 are similar; the difference is that, the semiconductor package 10*e* further includes semiconductor dies 900. As shown in the semiconductor package 10*e* of FIGS. 13-14, the semiconductor dies 900 are disposed on the illustrate top surface 500*t* of the substrate 500 and next the semiconductor die 100 along the central line CL2. For example, the semiconductor dies 900 are electrically connected to the semiconductor die 100 through the substrate 500 and the solder regions 202 and 204. As shown in FIG. 14, the semiconductor dies 900 are located at two opposite sides of the semiconductor die 100 with symmetry arrangement, for example.

In some embodiments, the semiconductor dies 900 are bonded to the substrate 500 through solder regions 204. For example, the semiconductor dies 900 are picked and placed on the substrate 500, and are bonded to the substrate 500 by flip-chip bonding. The formation and material of the solder regions 204 are similar to or substantially identical to the formation and material of the solder regions 202, and thus are not repeated herein. In some embodiments, an underfill (not shown) is formed on the substrate 500 to fill the gaps between the semiconductor dies 900 and the substrate 500, and wraps sidewalls of the solder regions 204 and the conductive vias 920. The underfill may be any acceptable material, such as a polymer, epoxy resin, molding underfill, or the like, for example. In one embodiment, the underfill may be formed by underfill dispensing, a capillary flow process, or any other suitable method.

However, the disclosure is not limited thereto; alternatively, similarly to the semiconductor die 100, the semiconductor dies 900 may be bonded to the substrate 500 through hybrid bonding. With hybrid bonding, the underfill may be omitted.

In some embodiments, the semiconductor dies 900 individually described herein may be referred to as a semiconductor chip or an integrated circuit (IC) having conductive vias 920, where the conductive vias 920 serve as conductive terminals of the semiconductor dies 900 for electrical connection to external components. In some embodiments, the semiconductor dies 900 each are a memory chip or device, such as a dynamic random-access memory (DRAM) die, static random-access memory (SRAM) die, hybrid memory cube (HMC) module, a high bandwidth memory (HBM) module, or the like. In the disclosure, the type of the semiconductor die 100 is different from the types of the semiconductor dies 900. As shown in FIG. 13, for example, four semiconductor dies 900 are shown for illustration purposes; however, the number of the semiconductor dies 900 is not limited to what is depicted in the disclosure, and may be selected and designated based on the demand and design layout.

It is appreciated that the modifications to the semiconductor package 10 may also be adopted by the semiconductor packages 10*a* through 10*e*. For example, the modification to the semiconductor package 10 as shown in the semiconductor package 10*a* can be adopted by the semiconductor package 10*b*, 10*c*, 10*d* and/or 10*e*. For example, the modification to the semiconductor package 10 as shown in the semiconductor package 10*b* can be adopted by the semiconductor package 10*a*, 10*c*, 10*d* and/or 10*e*. For example, the modification to the semiconductor package 10 as shown in the semiconductor package 10*c* can be adopted by the semiconductor package 10*a*, 10*b*, 10*d* and/or 10*e*. For example, the modification to the semiconductor package 10 as shown in the semiconductor package 10*d* can be adopted by the semiconductor package 10*a*, 10*b*, 10*c* and/or 10*e*. For example, the modification to the semiconductor package 10 as shown in the semiconductor package 10*e* can be adopted by the semiconductor package 10*a*, 10*b*, 10*c* and/or 10*d*. Since the details of the modifications to the semiconductor package 10 are described in FIG. 9 through FIG. 14, the detailed descriptions are omitted for brevity.

Figure 15:
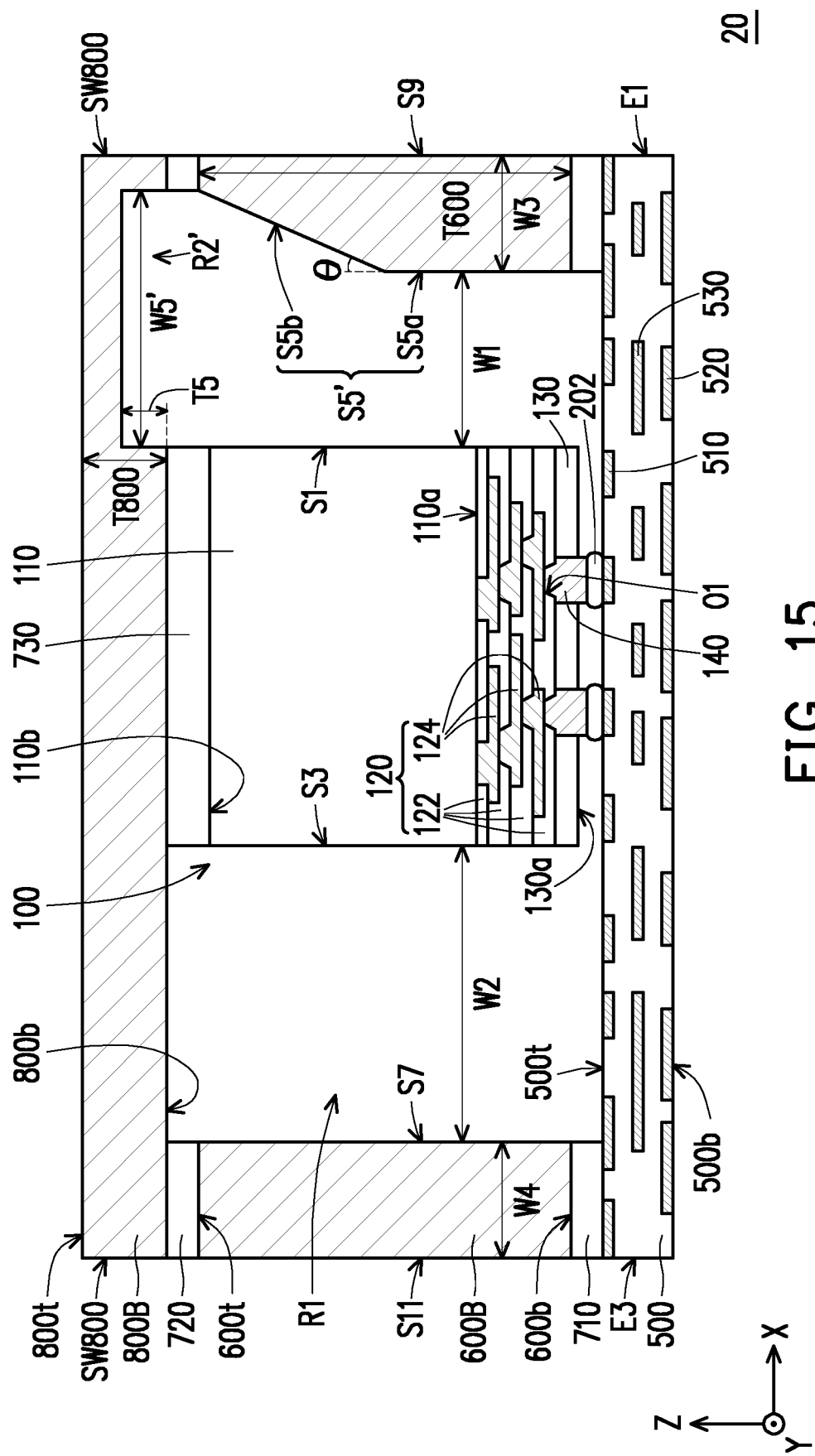
FIG. 15 is a schematic cross-sectional view showing a semiconductor package in accordance with some embodiments of the disclosure.
Figure 16:
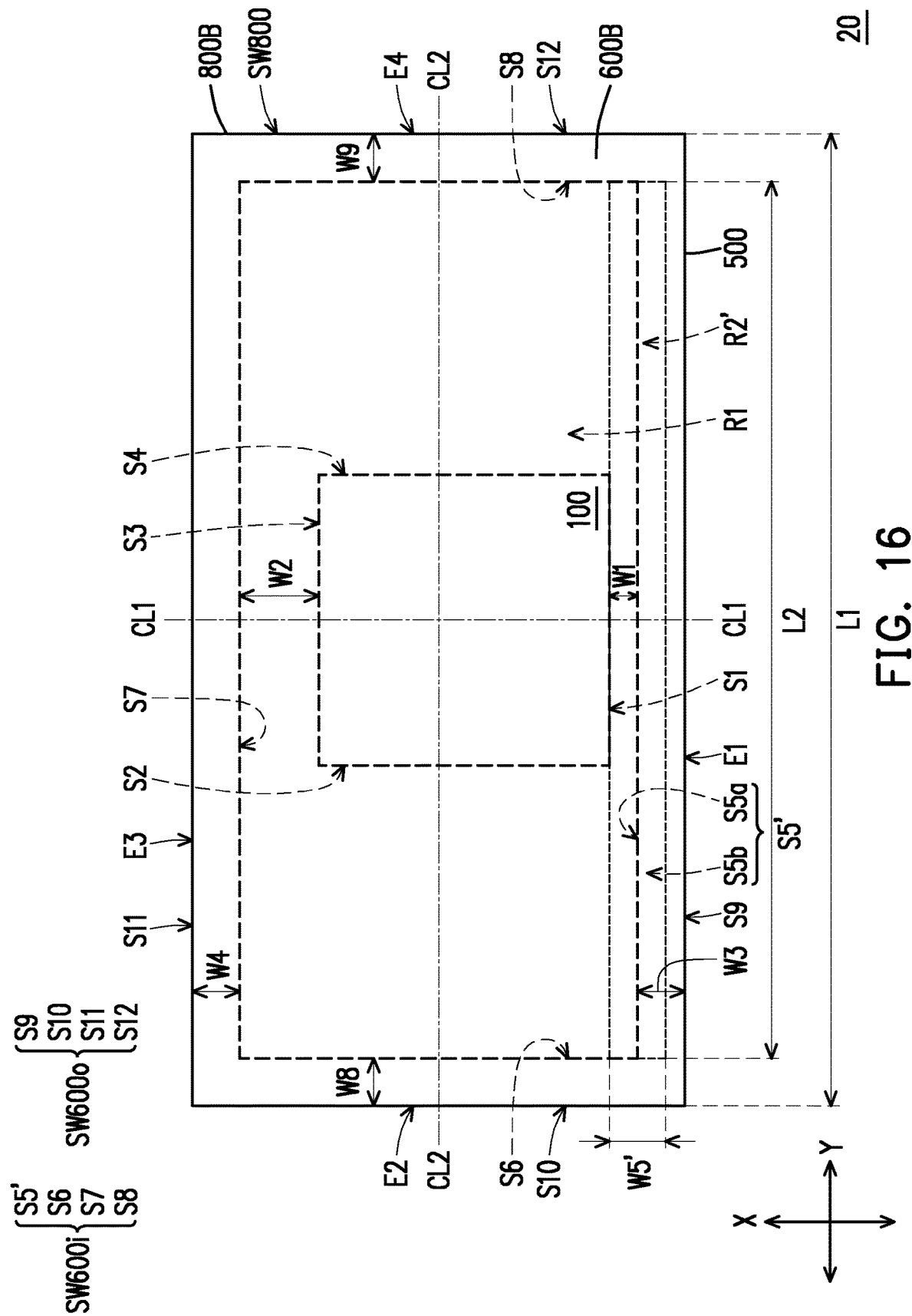
FIG. 16 is a schematic plane view illustrating a relative position of components included in the semiconductor package depicted in FIG. 15.
Figure 17:
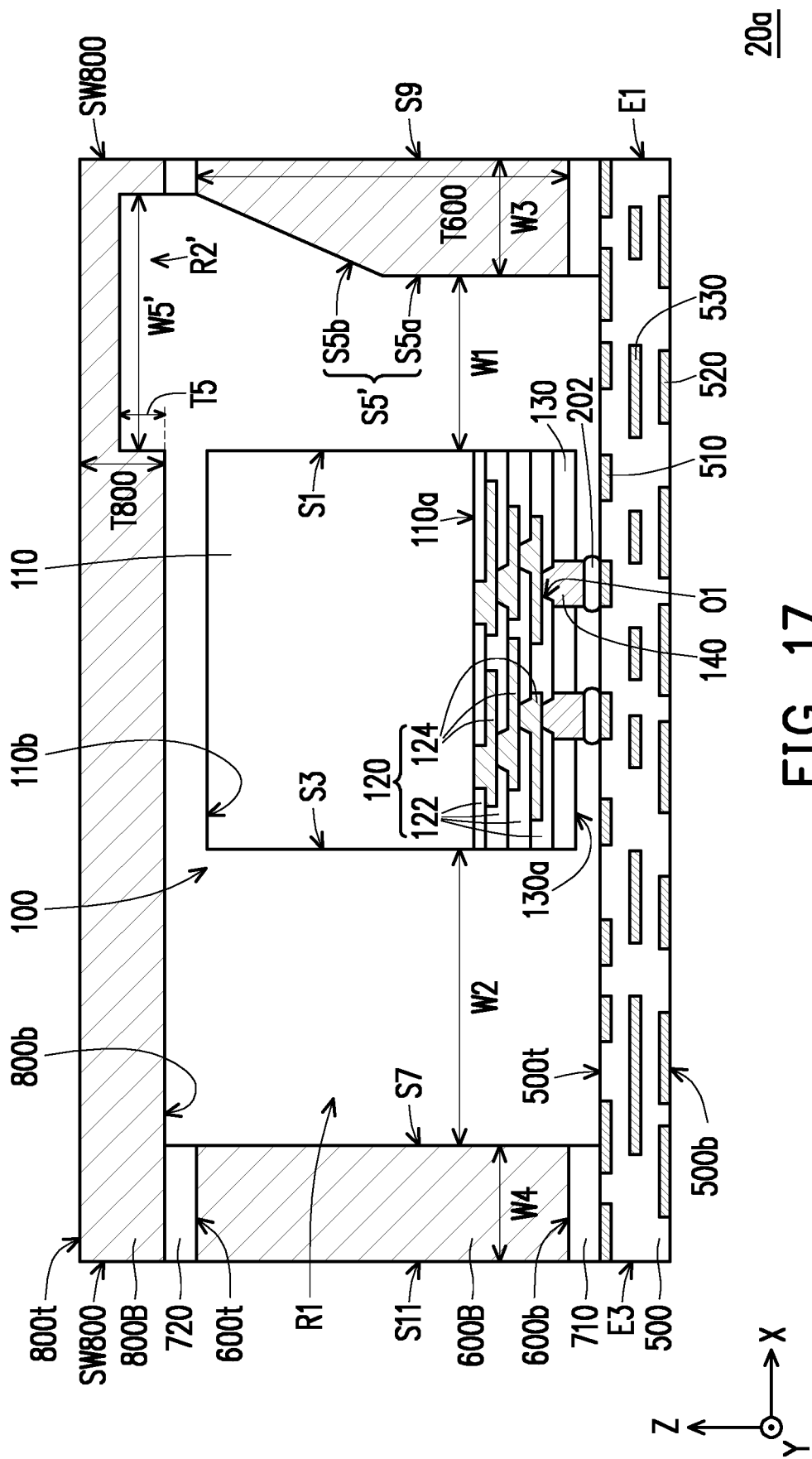
FIG. 17 is a schematic cross-sectional view showing a semiconductor package in accordance with some alternative embodiments of the disclosure.
Figure 21:
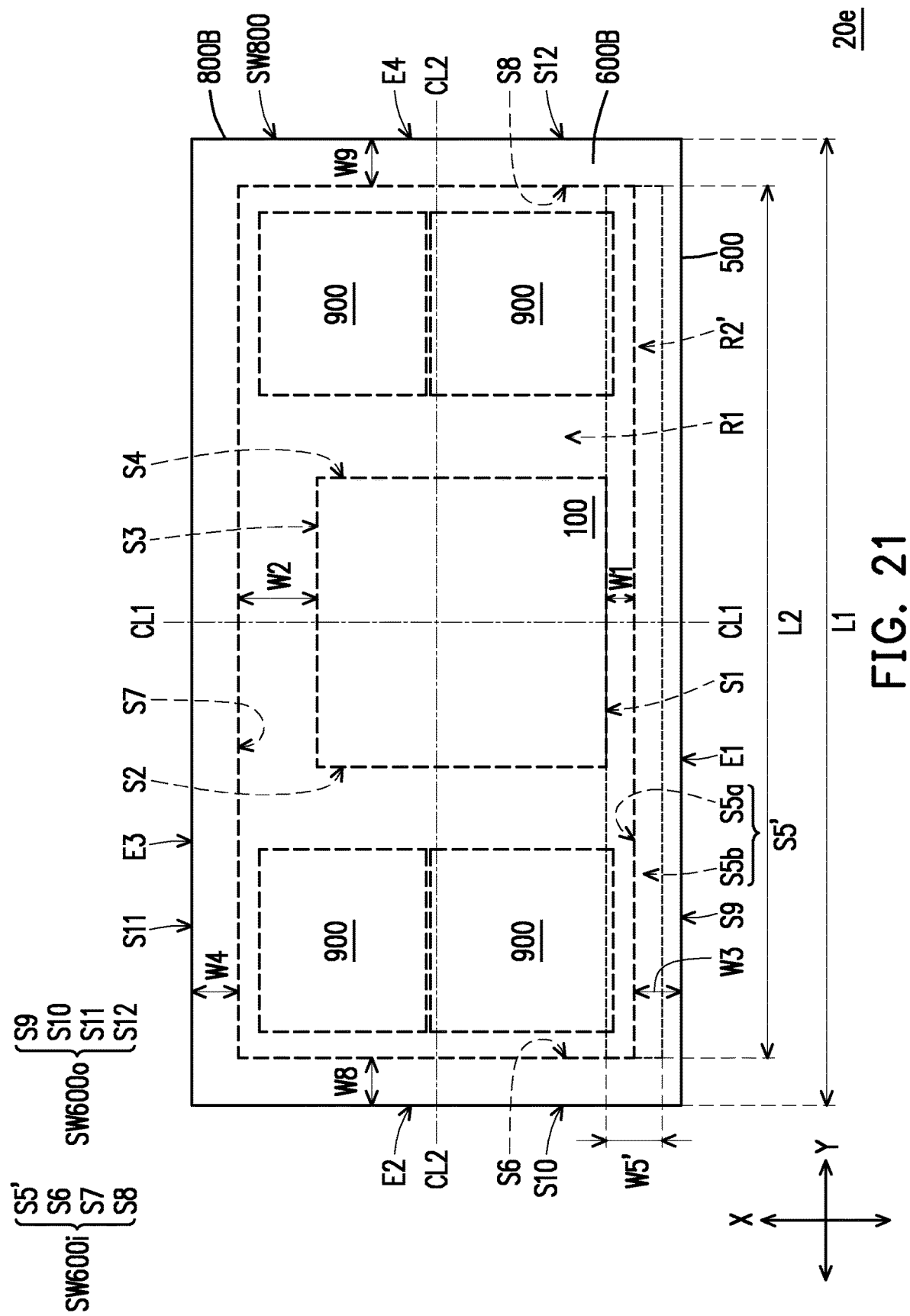
FIG. 21 is a schematic plane view illustrating a relative position of components included in a semiconductor package in accordance with some alternative embodiments of the disclosure.

FIG. 15 is a schematic cross-sectional view showing a semiconductor package 20 in accordance with some embodiments of the disclosure. FIG. 16 is a schematic plane view illustrating a relative position of components included in the semiconductor package depicted in FIG. 15, where FIG. 15 is the cross-sectional view taken along the central line CL1 depicted in FIG. 16. FIG. 17 through FIG. 20 are cross-sectional view showing a semiconductor package in accordance with some alternative embodiments of the disclosure along the central line CL1. FIG. 21 is a schematic plane view illustrating a relative position of components included in a semiconductor package in accordance with some alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the semiconductor package 20 of FIGS. 15-16 is similar to the semiconductor package 10 of FIGS. 5-7; the difference is that, the semiconductor package 20 includes a ring structure 600B and a lid 800B, instead of the ring structure 600A and the lid 800A.

Referring to FIG. 15 and FIG. 16, in some embodiments, the semiconductor package 20 includes a substrate 500, a semiconductor die 100 disposed on and electrically connected to the substrate 500, the ring structure 600B and the lid 800B. The semiconductor package 20 further includes an adhesive 710 adhering the ring structure 600B to the substrate 500, and an adhesive 720 adhering the lid 800B to the ring structure 600B. Through the adhesive 710, the ring structure 600B is electrically and thermally connected to the substrate 500, for example. Through the adhesive 720, the lid 800B is electrically and thermally connected to the ring structure 600B, where the lid 800B is electrically and thermally connected to the substrate 500 through the ring structure 600B and the adhesives 710, 720. The lid 800B may be referred to as the heat dissipating element of the semiconductor package 20. Alternatively, the lid 800B, the ring structure 600B and the adhesive 720 therebetween together may be referred to as the heat dissipating element of the semiconductor package 20. Owing to such heat dissipating element, the heat dissipation of the semiconductor die 100 in the semiconductor package 20 is improved. The formation and material of each of the semiconductor die 100, the substrate 500 and the adhesive 710, 720 have described in FIG. 1 through FIG. 7, and thus are not repeated herein for simplicity.

The semiconductor package 20 further includes a thermal interface material 730 adhering the semiconductor die 100 to the lid 800B. Through the thermal interface material 730, the thermal couple between the semiconductor die 100 and the lid 800B are enhanced, which further helps to dissipate heat from the semiconductor die 100 to the lid 800B. The formation and material of the thermal interface material 730 have described in FIG. 5 through FIG. 7, and thus are not repeated herein for simplicity. However, the disclosure is not limited thereto. Alternatively, the thermal interface material 730 may be omitted, as a semiconductor package 20a of FIG. 17.

In some embodiments, the lid 800B, the adhesive 720, the ring structure 600B and the adhesive 710 together constitute an EMI shielding structure (which is electrically connected to the substrate 500) for the semiconductor die 100. Due to the EMI shielding structure, the impact causing by electromagnetic wave generated from other electronic elements located outside the semiconductor package 20 can be suppressed, thereby enhancing reliability and performance of the semiconductor package 20.

In some embodiments, in the top view (e.g., the X-Y plane), the ring structure 600B is in a form of a full (continuous) frame annulus having an inner sidewall SW600i facing the sidewall of the semiconductor die 100 and an outer sidewall SW600o opposite to the inner sidewall SW600i, where the outer sidewall SW600o is substantially aligned with the sidewall of the substrate 500 in the direction Z. In some embodiments, the ring structure 600B has a rectangular annulus shape in the top view with two opposite long sides and two opposite short sides. In some embodiments, the inner sidewall SW600i of the ring structure 600B includes sides S5', S6, S7 and S8 and the outer sidewall SW600o of the ring structure 600B includes sides S9, S10, S11 and S12. In some embodiments, the ring structure 600B is similar to the ring structure 600A, where the sides S6, S7 and S8 the inner sidewall SW600i of the ring structure 600B and the sides S9, S10, S11 and S12 of the outer sidewall SW600o of the ring structure 600B each are a substantially continuous vertical surface; except that the side S5' of the inner sidewall SW600i is a non-vertical surface. In other words, the side S5' of the inner sidewall SW600i may be a non-planar surface. For example, as shown in FIG. 15, the side S5' includes a planar surface S5a and a planar surface S5b connecting to the planar surface S5a, where the planar surface S5a is substantially parallel to the side S9, and the planar surface S5b is not parallel to the planar surface S5a. As shown in FIG. 15, an angle θ is between an extending plane (indicated as a dotted line) of the planar surface S5a and the planar surface S5b. In some embodiments, the angle θ is an acute angle. In certain embodiments, the angle θ is approximately in a range of 0° to 90°. For example, the planar surface S5b is a slant surface, as shown in FIG. 15. In some embodiments, the outer sidewall SW600o of the ring structure 600B is a substantially continuous vertical sidewall.

As illustrated in FIG. 15 and FIG. 16, in some embodiments, the lid 800B includes a recess R2', where the recess R2' is spatially communicated with the recess R1. For example, the recess R2' has an opening (not labeled) at the bottom surface 800b of the lid 800B, where a sidewall of the recess R2' extends from the opening into the lid 800B along the direction Z. In some embodiments, as shown in FIG. 15 and FIG. 16, a thickness T5 of the recess R2' is greater than 0 and is less than or substantially equal to a thickness T800 of the lid 800B, as measured along the direction Z. For example, the thickness T5 of the recess R2' is greater than 0 and is less than or substantially equal to half of the thickness T800 of the lid 800B. In other words, the recess R2' is not penetrated through the lid 800B.

In some embodiments, the recess R2' is overlapped with the offset position (e.g. the gap W1) in a vertical projection on the substrate 500 along the direction Z as shown in FIG. 15 and FIG. 16. In some embodiments, the recess R2' is extended from the first side S1 towards the sidewall SW800 of the lid 800B, where a portion of the sidewall of the recess R2' is substantially aligned with the first side S1 of the semiconductor die 100, and the recess R2' is partially overlapped with the ring structure 600B. That is, a positioning location of the recess R2' is next to a positioning location of the semiconductor die 100 and partially within (e.g. overlapped with) a positioning location of the ring structure 600B in the vertical projection along direction Z. For example, in the top view of FIG. 16, the recess R2' has a length L2 less than a length L1 of the lid 800B and a width W5' greater than 0. In some embodiments, the width W5' is greater than the offset position (e.g. the gap W1), as shown in FIG. 15 and FIG. 16. With such non-planar surface (e.g. S5') included in the inner sidewall SW600i of the ring structure 600B, the width W5' of the recess R2' formed in the lid 800B is greater than the width W5 of the recess R2 formed in the lid 800A. Owing to such recess R2', more flexibility in deformation ability of the lid 800B at a location of the recess R2' is further allowed, so as to avoid, suppress or reduce stress concentration and/or delamination issues caused by a stress induced by CTE mismatch and/or modulus mismatch at the adhesive between two components (e.g., between the lid 800B and the ring structure 600B and/or between the ring structure 600B and the substrate 500). In experimental perspective, the stress in the adhesive 720 is reduced about 13%~20% compared to a conventional lid without a recess corresponding to the offset position.

Figure 18:
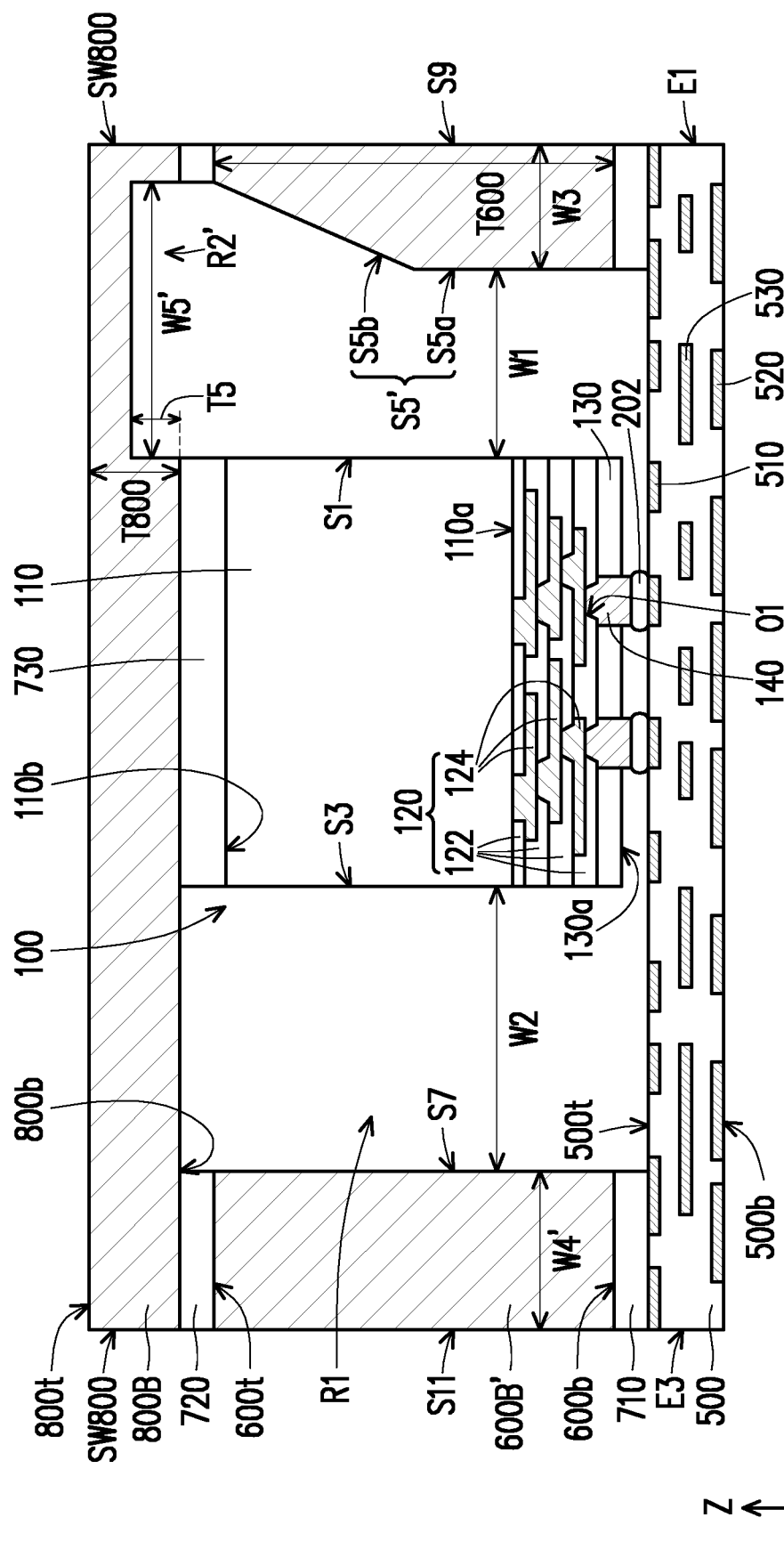
FIG. 18 is a schematic cross-sectional view showing a semiconductor package in accordance with some alternative embodiments of the disclosure.
Figure 19:
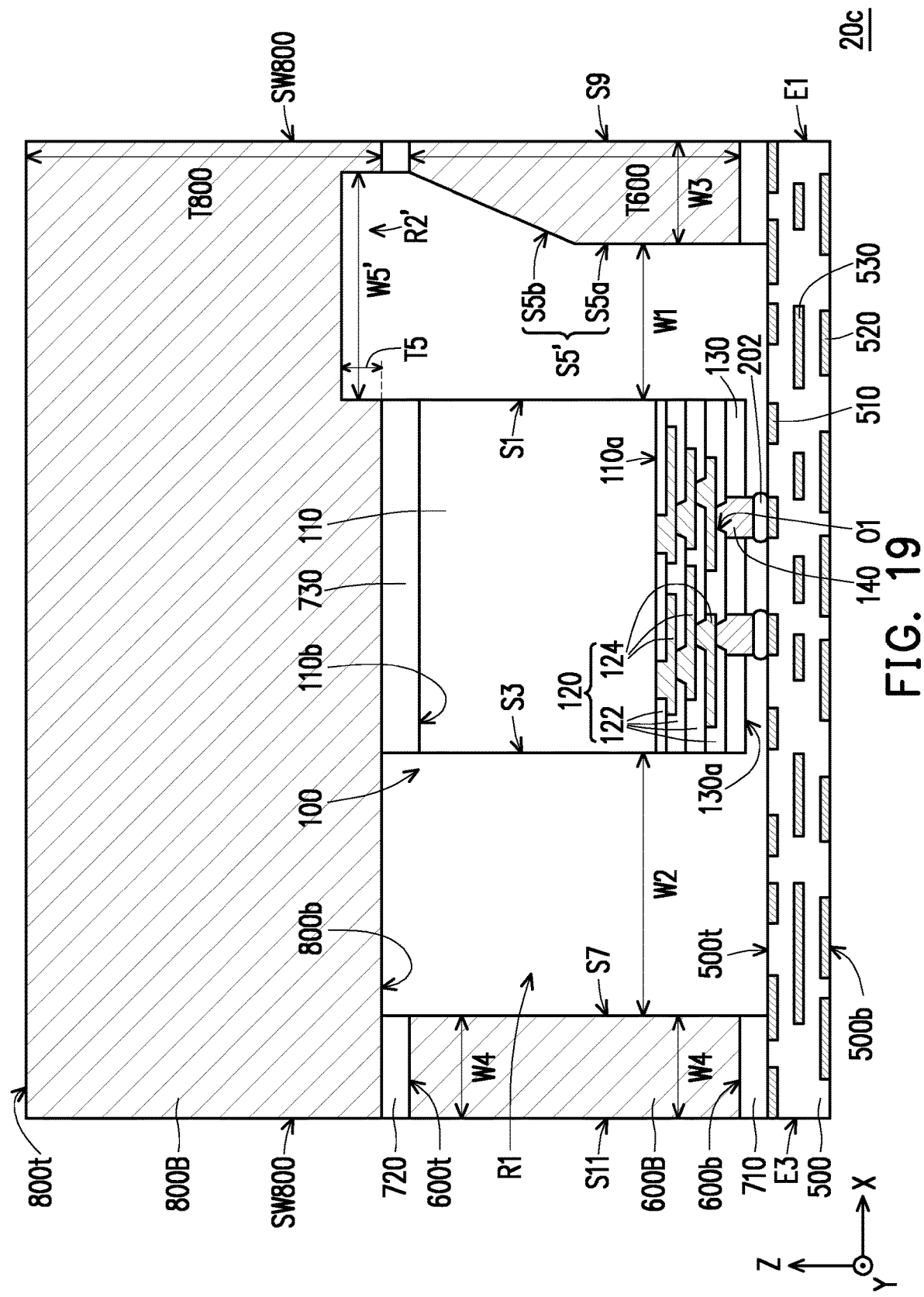
FIG. 19 is a schematic cross-sectional view showing a semiconductor package in accordance with some alternative embodiments of the disclosure.
Figure 20:
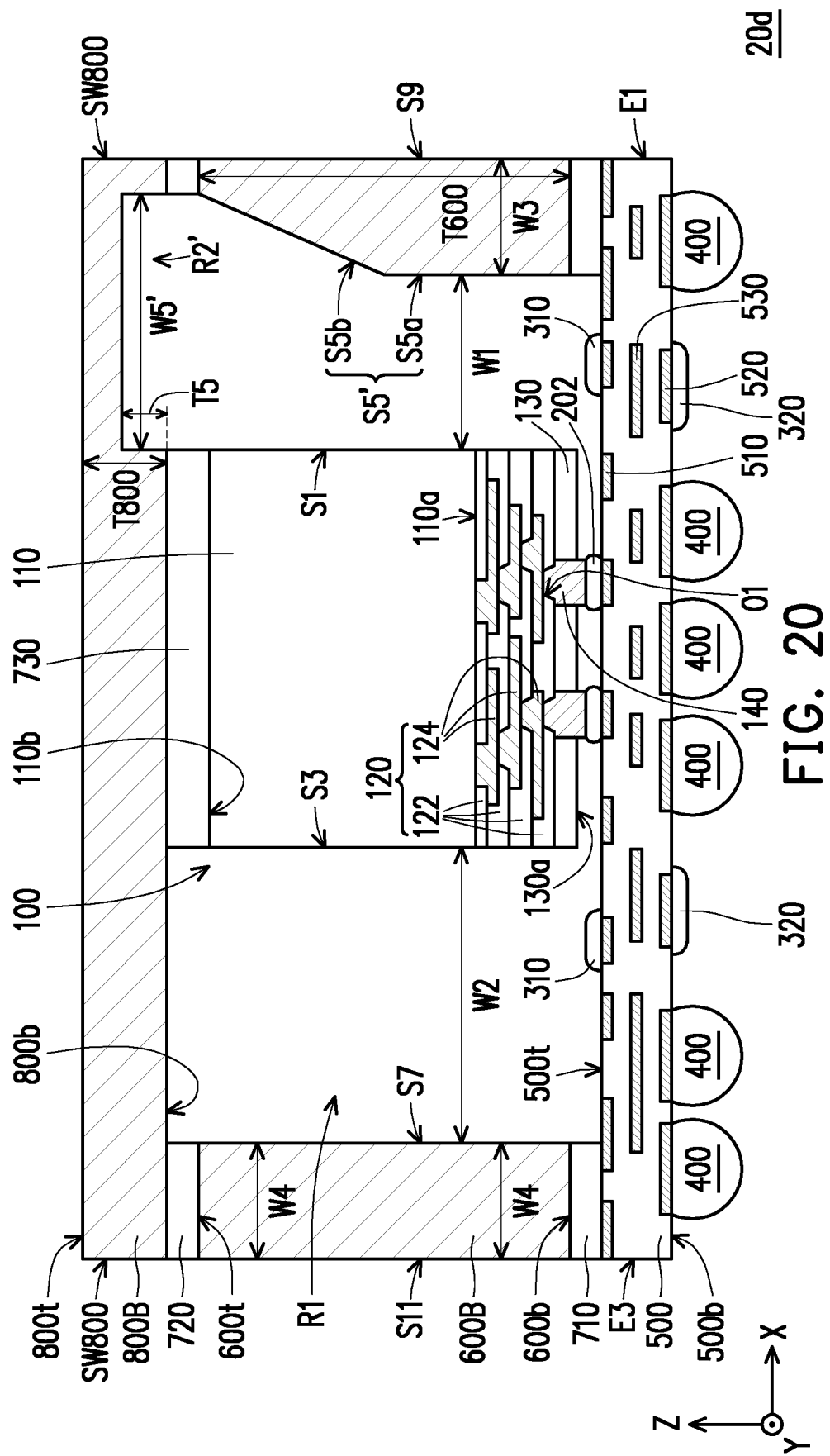
FIG. 20 is a schematic cross-sectional view showing a semiconductor package in accordance with some alternative embodiments of the disclosure.

The ring structure 600B may have a substantially identical thickness in the top view. For example, as shown in the top view of FIG. 16, where the thicknesses W3, W4, W8 and W9 are substantially identical. However, the disclosure is not limited thereto; as long as the gap W2 is greater than the gap W1 and the gaps W6 and W7 are substantially identical, the thicknesses W3, W4, W8 and W9 may be different from or equal to each other. For example, the thickness W3 may be different from the thickness W4. In some embodiments, a semiconductor package 20b of FIG. 18 and the semiconductor package 20 of FIG. 15 are similar; the difference is that, the ring structure 600B is substituted with a ring structure 600B', where the ring structure 600B' has non-uniform thickness in a top view. In the ring structure 600B', the thickness W4' may be different from the thicknesses W3, W8 and W9. For example, the thickness W4' is greater than the thickness W3 as shown in FIG. 18, while the thicknesses W3, W8 and W9 are identical (not shown). In alternative embodiments, the thickness W4' is less than the thickness W3 (not shown) while the thicknesses W3, W8 and W9 are identical. Or, the thickness W3 may be greater than, less than or substantially equal to the thickness W4', while the thicknesses W4', W8 and W9 may be identical.

The thickness T600 of the ring structure 600B may have greater than, less than or substantially equal to the thickness T800 of the lid 800B. For example, in the semiconductor package 20 of FIG. 15, a thickness T600 of the ring structure 600B is greater than the thickness T800 of the lid 800B, as measured along the direction Z. However, the disclosure is not limited thereto. For example, a semiconductor package 20c of FIG. 19 and the semiconductor package 20 of FIG. 15 are similar; the difference is that, the thickness T600 of the ring structure 600B is substantially equal to the thickness T800 of the lid 800B, as measured along the direction Z. Alternatively, the thickness T600 of the ring structure 600B may be less than the thickness T800 of the lid 800B, as measured along the direction Z.

In alternative embodiments, additional semiconductor devices and/or additional conductive terminals may be adopted. For example, a semiconductor package 20d of FIG. 20 and the semiconductor package 20 of FIG. 15 are similar; the difference is that, the semiconductor package 20d further includes semiconductor devices 310, 320 and a plurality of conductive terminals 400. As shown in the semiconductor package 20d of FIG. 20, the semiconductor devices 310 are disposed on the illustrate top surface 500t of the substrate 500 and next the semiconductor die 100 along the along the central line CL1, the semiconductor devices 320 are disposed on the illustrate bottom surface 500b of the substrate 500, and the conductive terminals 400 are disposed on the illustrate bottom surface 500b of the substrate 500 and next to the semiconductor devices 320. In some embodiments, some of the conductive terminals 400 are electrically connected to the semiconductor die 100 through the substrate 500, some of the conductive terminals 400 are electrically connected to the semiconductor devices 310, and some of the conductive terminals 400 are electrically connected to the semiconductor devices 320. In some embodiments, the semiconductor devices 310 are electrically connected to the semiconductor die 100 through the substrate 500, and the semiconductor device 320 are electrically connected to the semiconductor die 100 through the substrate 500. In some embodiments, the semiconductor devices 310 are electrically connected to the semiconductor device 320 through the substrate 500. The details, formation and material of each of the semiconductor devices 310, 320 and the conductive terminals 400 have described in FIG. 12, and thus are not repeated herein for simplicity.

In alternative embodiments, additional semiconductor dies may be adopted. For example, a semiconductor package 20e of FIG. 21 and the semiconductor package 20 of FIG. 15 are similar; the difference is that, the semiconductor package 20e further includes semiconductor dies 900. As shown in the semiconductor package 20e of FIG. 21, in some embodiments, the semiconductor dies 900 are disposed on the illustrate top surface 500t of the substrate 500 and next the semiconductor die 100 along the central line CL2. For example, the semiconductor dies 900 are electrically connected to the semiconductor die 100 through the substrate 500. As shown in FIG. 21, the semiconductor dies 900 are located at two opposite sides of the semiconductor die 100 with symmetry arrangement, for example. The details, formation and material of the semiconductor dies 900 have described in FIG. 13 and FIG. 14, and thus are not repeated herein for simplicity.

It is appreciated that the modifications to the semiconductor package 20 may also be adopted by the semiconductor packages 20a through 20e. For example, the modification to the semiconductor package 20 as shown in the semiconductor package 20a can be adopted by the semiconductor package 20b, 20c, 20d and/or 20e. For example, the modification to the semiconductor package 20 as shown in the semiconductor package 20b can be adopted by the semiconductor package 20a, 20c, 20d and/or 20e. For example, the modification to the semiconductor package 20 as shown in the semiconductor package 20c can be adopted by the semiconductor package 20a, 20b, 20d and/or 20e. For example, the modification to the semiconductor package 20 as shown in the semiconductor package 20d can be adopted by the semiconductor package 20a, 20b, 20c and/or 20e. For example, the modification to the semiconductor package 20 as shown in the semiconductor package 20e can be adopted by the semiconductor package 20a, 20b, 20c and/or 20d. Since the details of the modifications to the semiconductor package 20 are described in FIG. 17 through FIG. 21, the detailed descriptions are omitted for brevity.

Figure 22:
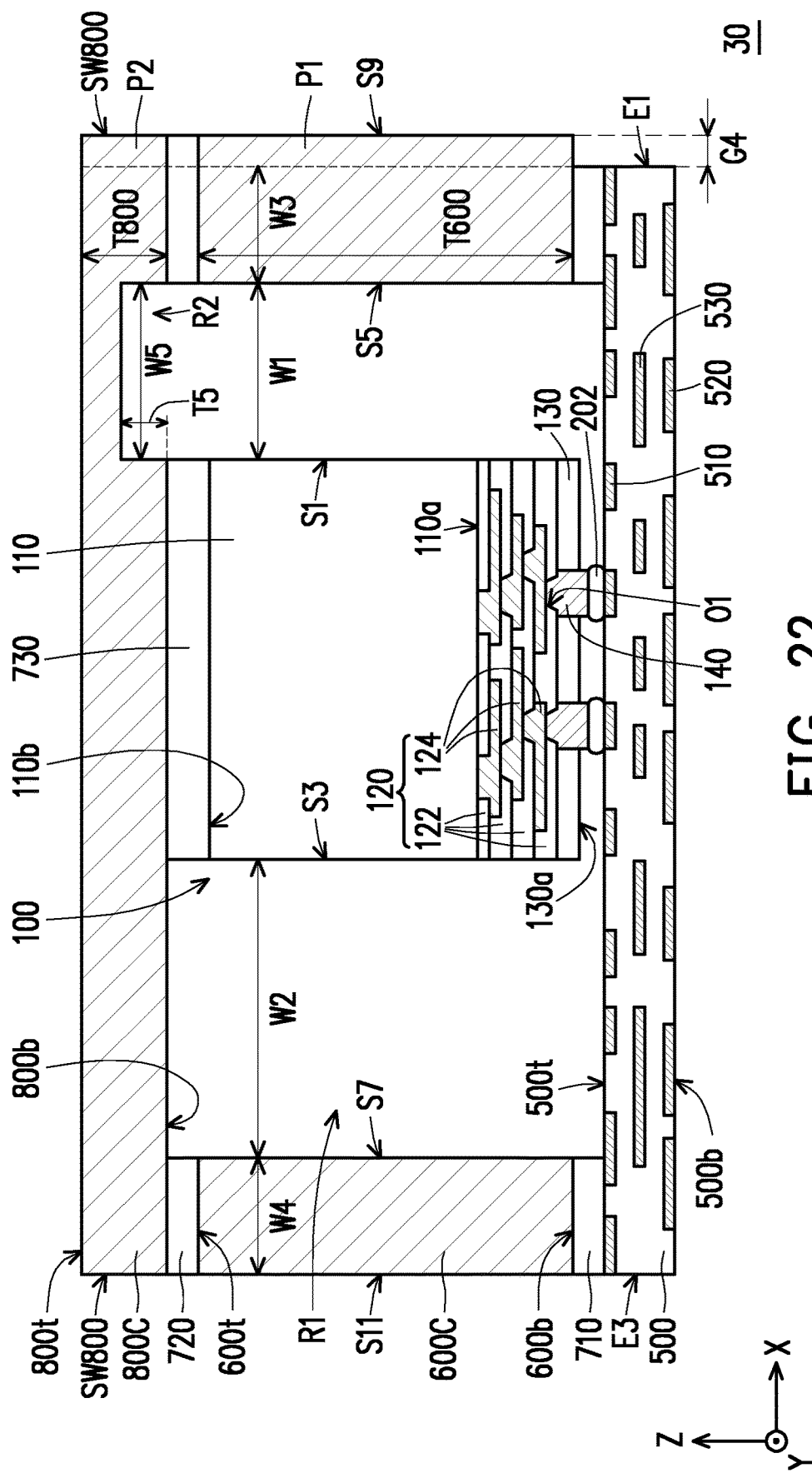
FIG. 22 is a schematic cross-sectional view showing a semiconductor package in accordance with some embodiments of the disclosure.
Figure 23:
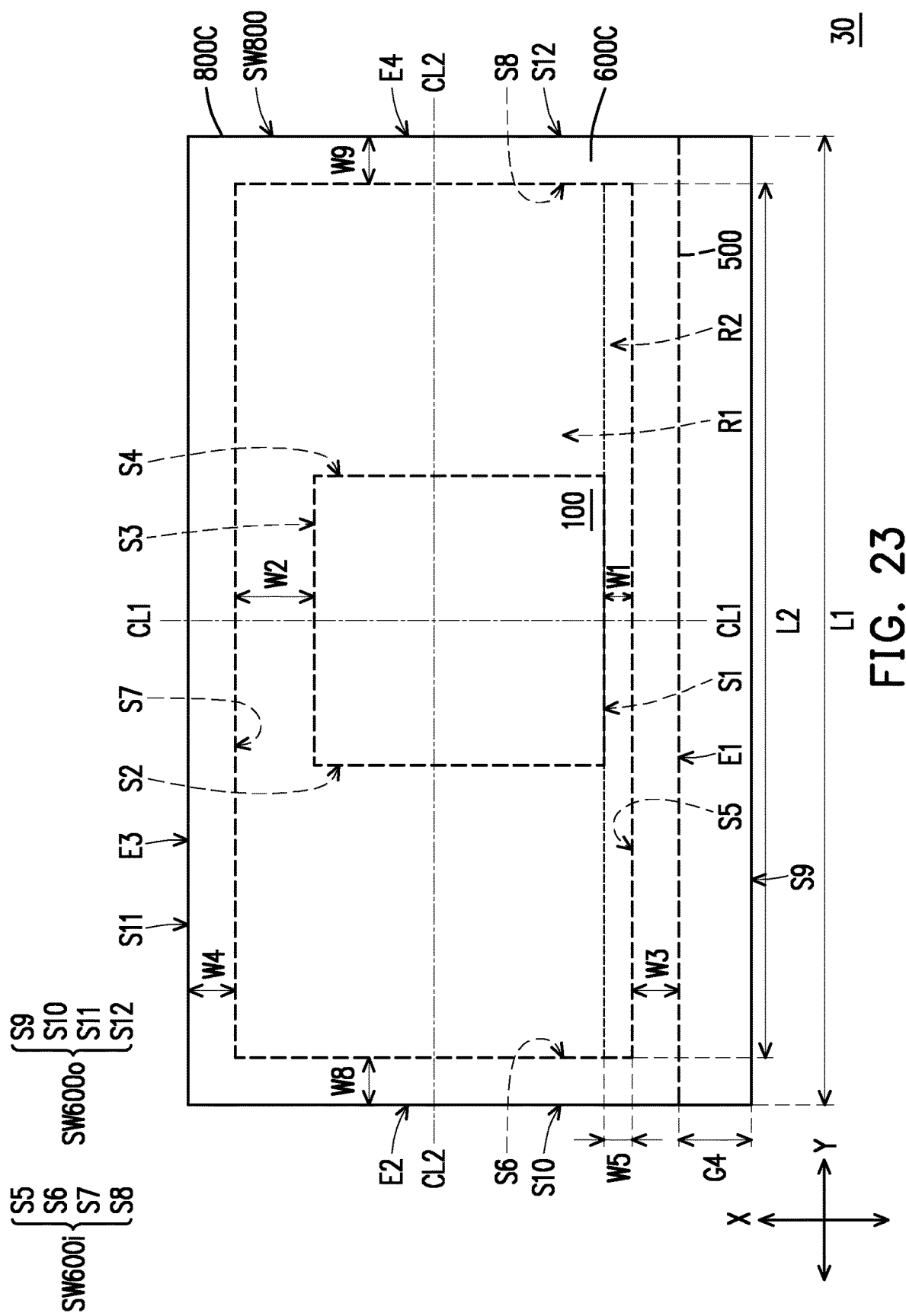
FIG. 23 is a schematic plane view illustrating a relative position of components included in the semiconductor package depicted in FIG. 22.
Figure 24:
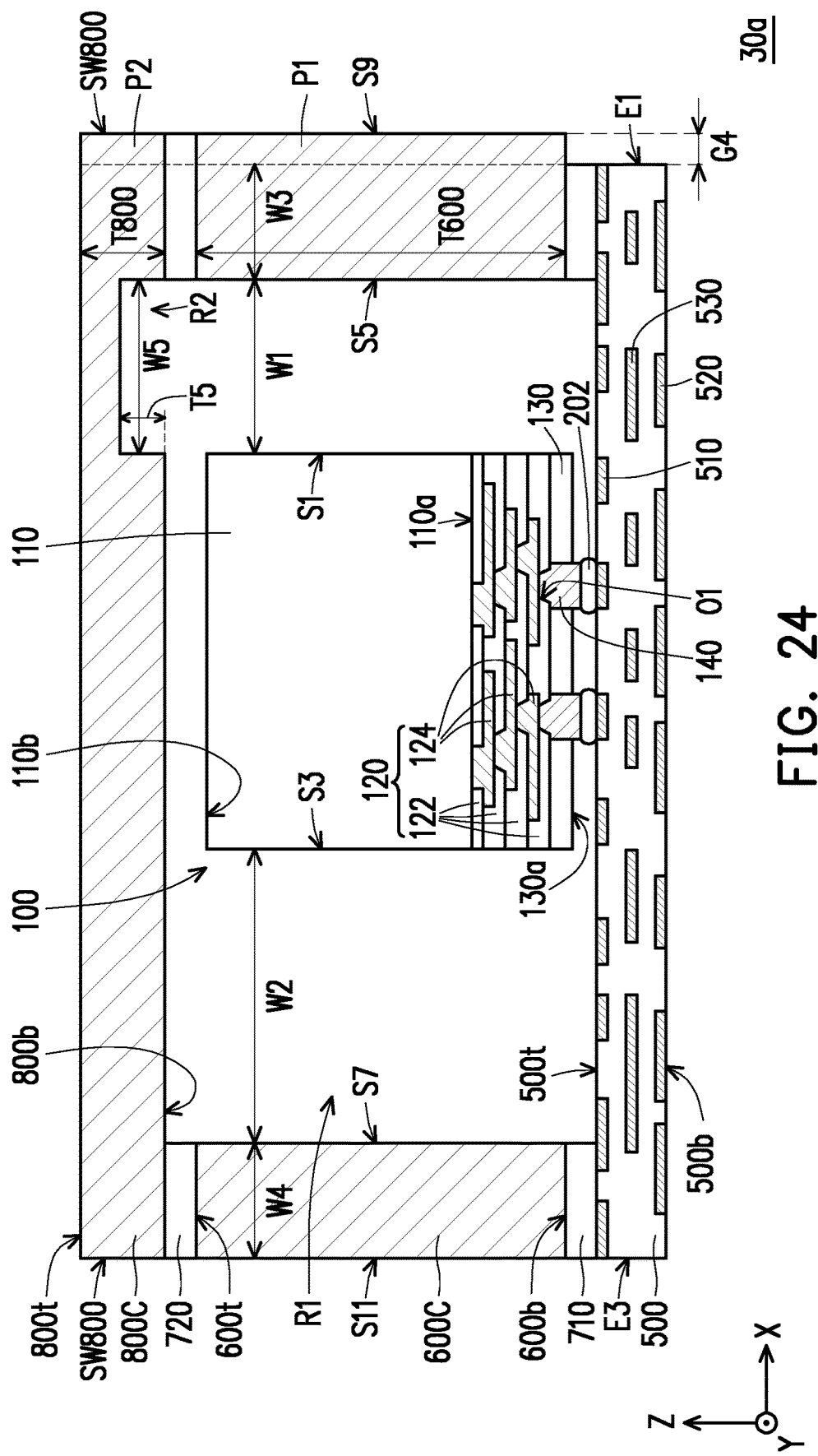
FIG. 24 is a schematic cross-sectional view showing a semiconductor package in accordance with some alternative embodiments of the disclosure.

FIG. 22 is a schematic cross-sectional view showing a semiconductor package 30 in accordance with some embodiments of the disclosure. FIG. 23 is a schematic plane view illustrating a relative position of components included in the semiconductor package depicted in FIG. 22, where FIG. 22 is the cross-sectional view taken along the central line CL1 depicted in FIG. 23. FIG. 24 is a schematic cross-sectional view showing a semiconductor package in accordance with some alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the semiconductor package 30 of FIGS. 22-23 is similar to the semiconductor package 10 of FIGS. 5-7; the difference is that, the semiconductor package 30 includes a ring structure 600C and a lid 800C, substituting the ring structure 600A and the lid 800A.

As illustrated in FIG. 22 and FIG. 23, in some embodiments, the ring structure 600C has a top view in a form of a full (continuous) frame annulus having an inner sidewall SW600i facing the sidewall of the semiconductor die 100 and an outer sidewall SW600o opposite to the inner sidewall SW600i, where the outer sidewall SW600o is offset from the sidewall of the substrate 500. For example, a portion P1 of the ring structure 600C and a portion P2 of the lid 800C are protruded out from the sidewall (e.g. E1) of the substrate 500 by a gap G4, as shown in FIG. 22 and FIG. 23. The portion P1 of the ring structure 600C may referred to as an overhang (or protrusion) portion of the ring structure 600C cantilevered over the edge E1 of the substrate 500, and the portion P2 of the lid 800C may referred to as an overhang (or protrusion) portion of the lid 800C cantilevered over the edge E1 of the substrate 500, in the disclosure. In other words, for example, the outer sidewall SW600o (e.g. S9) of the ring structure 600C is offset from the sidewall (e.g. E1) of the substrate 500 by the gap G4. In some embodiments, in the top view, the outer sidewall SW600o of the ring structure 600C is substantially aligned with the sidewall SW800 of the lid 800C. Due to the overhang (or protrusion) portions (e.g. P1 and P2), an adhesion between two components (e.g., between the ring structure 600C and the lid 800C) can be enhanced as the contact area therebetween is increased.

It is appreciated that the modifications to the semiconductor package 10 may also be adopted by the semiconductor package 30. Since the details of the modifications to the semiconductor package 10 are described in FIG. 9 through FIG. 14, the detailed descriptions are omitted for brevity. For example, the thermal interface material 730 can be omitted, see a semiconductor package 30a of FIG. 24. For example, the lid 800C is separated apart from (the backside surface 110b of) the semiconductor die 100 by a gap, such as an air gap, as shown in FIG. 24.

Figure 25:
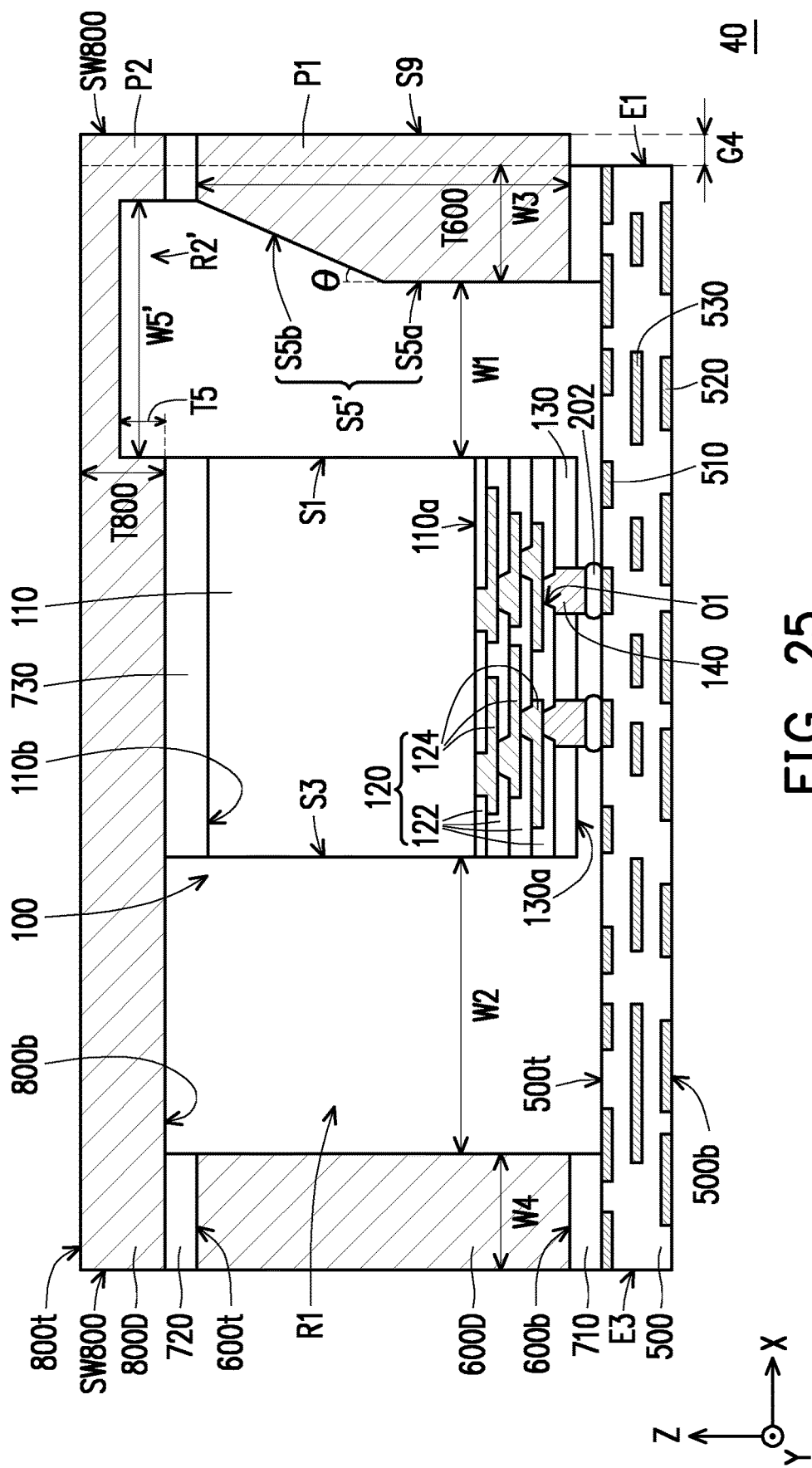
FIG. 25 is a schematic cross-sectional view showing a semiconductor package in accordance with some embodiments of the disclosure.
Figure 26:
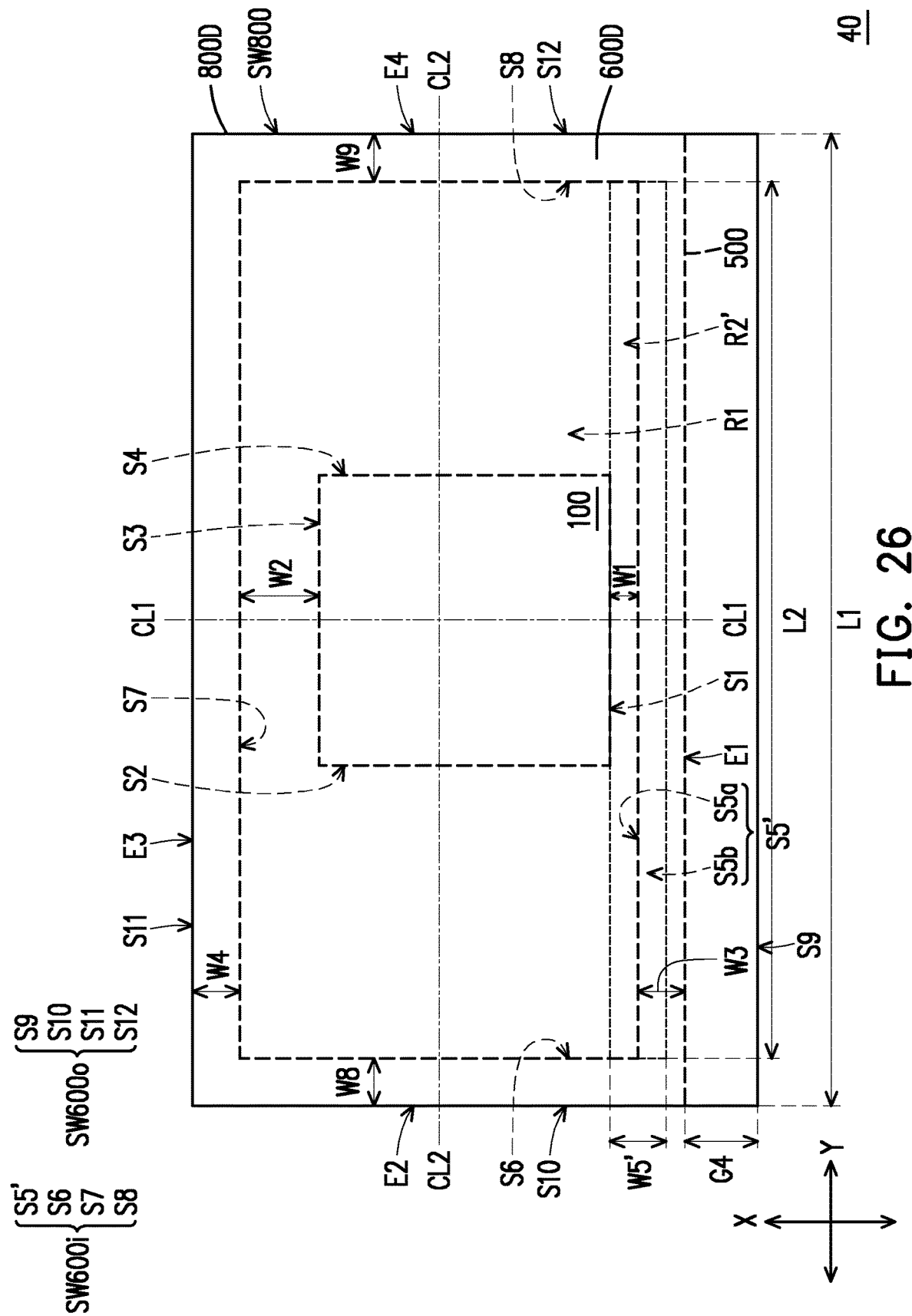
FIG. 26 is a schematic plane view illustrating a relative position of components included in the semiconductor package depicted in FIG. 25.
Figure 27:
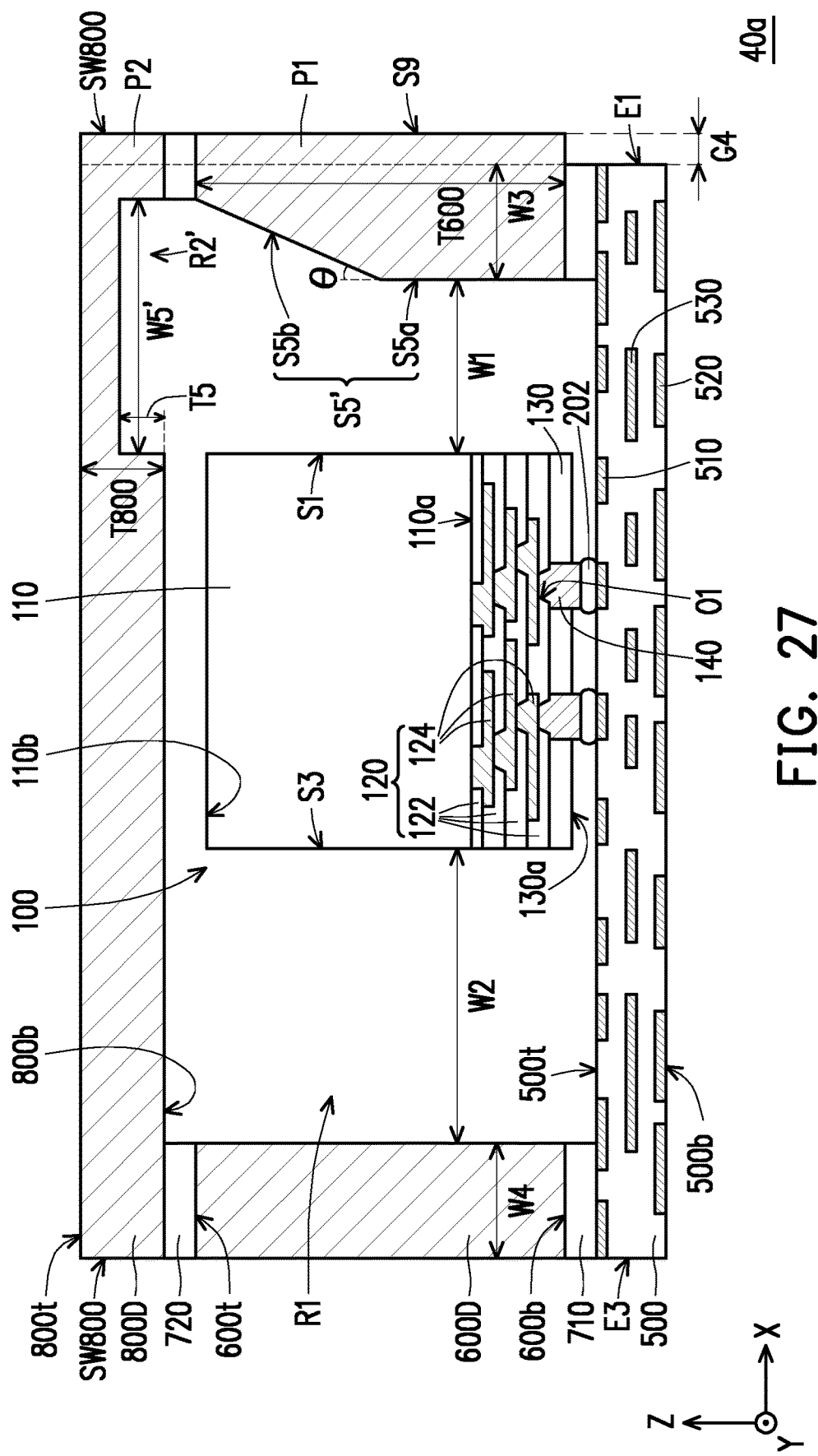
FIG. 27 is a schematic cross-sectional view showing a semiconductor package in accordance with some alternative embodiments of the disclosure.

FIG. 25 is a schematic cross-sectional view showing a semiconductor package 40 in accordance with some embodiments of the disclosure. FIG. 26 is a schematic plane view illustrating a relative position of components included in the semiconductor package depicted in FIG. 25, where FIG. 25 is the cross-sectional view taken along the central line CL1 depicted in FIG. 26. FIG. 27 is a schematic cross-sectional view showing a semiconductor package in accordance with some alternative embodiments of the disclosure. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, the semiconductor package 40 of FIGS. 25-26 is similar to the semiconductor package 20 of FIGS. 15-16; the difference is that, the semiconductor package 40 includes a ring structure 600D and a lid 800D, instead of the ring structure 600B and the lid 800C.

As illustrated in FIG. 25 and FIG. 26, in some embodiments, the ring structure 600D has a top view in a form of a full (continuous) frame annulus having an inner sidewall SW600i facing the sidewall of the semiconductor die 100 and an outer sidewall SW600o opposite to the inner sidewall SW600i, where the outer sidewall SW600o is offset from the sidewall of the substrate 500. For example, a portion P1 of the ring structure 600D and a portion P2 of the lid 800D are protruded out from the sidewall (e.g. E1) of the substrate 500 by a gap G4, as shown in FIG. 25 and FIG. 26. The portion P1 of the ring structure 600D may referred to as an overhang (or protrusion) portion of the ring structure 600D cantilevered over the edge E1 of the substrate 500, and the portion P2 of the lid 800D may referred to as an overhang (or protrusion) portion of the lid 800D cantilevered over the edge E1 of the substrate 500, in the disclosure. In other words, for example, the outer sidewall SW600o (e.g. S9) of the ring structure 600D is offset from the sidewall (e.g. E1) of the substrate 500 by the gap G4. In some embodiments, in the top view, the outer sidewall SW600o of the ring structure 600D is substantially aligned with the sidewall SW800 of the lid 800D. Due to the overhang (or protrusion) portions (e.g. P1 and P2), an adhesion between two components (e.g., between the ring structure 600D and the lid 800D) can be enhanced as the contact area therebetween is increased.

It is appreciated that the modifications to the semiconductor package 20 may also be adopted by the semiconductor package 40. Since the details of the modifications to the semiconductor package 20 are described in FIG. 17 through FIG. 21, the detailed descriptions are omitted for brevity. For example, the thermal interface material 730 can be omitted, see a semiconductor package 40a of FIG. 27. For example, the lid 800D is separated apart from (the backside surface 110b of) the semiconductor die 100 by a gap, such as an air gap, as shown in FIG. 27.

Figure 28:
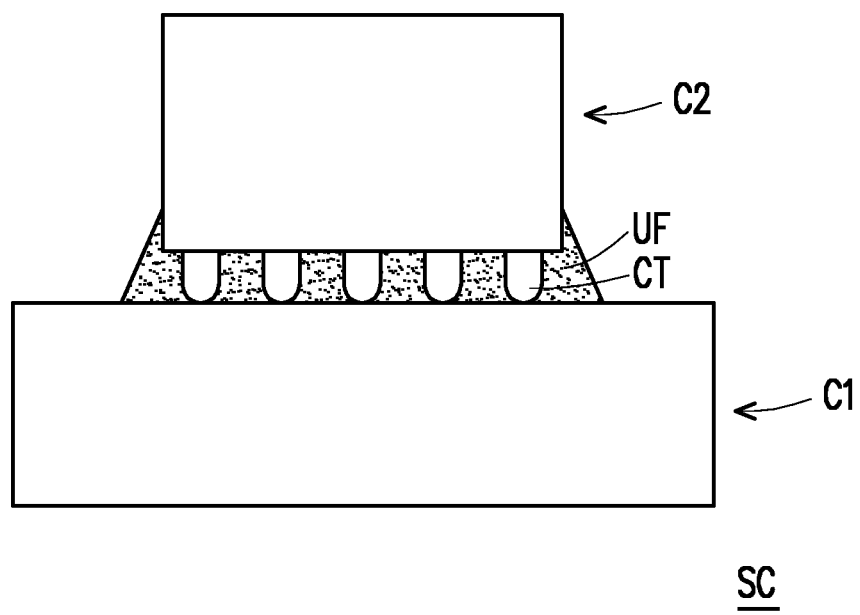
FIG. 28 is a schematic cross-sectional view showing a semiconductor package in accordance with some embodiments of the disclosure.

FIG. 28 is a schematic cross-sectional view showing a semiconductor package in accordance with some embodiments of the disclosure. Like elements are designated with the same reference numbers for ease of understanding and the details thereof are not repeated herein. Referring to FIG. 28, in some embodiments, a component assembly SC including a first component C1 and a second component C2 disposed over the first component C1 is provided. The first component C1 may be or may include a circuit structure, such as a mother board, a package substrate, another printed circuit board (PCB), a printed wiring board, an interposer, and/or other carrier that is capable of carrying integrated circuits. In some embodiments, the second component C2 mounted on the first component C1 is similar to one of the semiconductor packages 10, 10a-10e, 20, 20a-20e, 30, 30a, 40, 40a and their modifications described above. For example, one or more the semiconductor packages (e.g., 10, 10a-10e, 20, 20a-20e, 30, 30a, 40, 40a) may be electrically coupled to the first component C1 through a plurality of terminals CT. The terminals CT may be the conductive terminals 400 as described in FIG. 12 and FIG. 20.

In some embodiments, an underfill layer UF is formed between the gap of the first component C1 and the second component C2 to at least laterally cover the terminals CT. Alternatively, the underfill layer UF is omitted. The underfill layer UF may be any acceptable material, such as a polymer, epoxy resin, molding underfill, or the like, for example. In one embodiment, the underfill may be formed by underfill dispensing, a capillary flow process, or any other suitable method. Owing to the underfill layer UF, a bonding strength between the first component C1 and the second component C2 is enhanced.

In accordance with some embodiments, a semiconductor package includes a substrate, a semiconductor die, a ring structure and a lid. The semiconductor die is disposed on the substrate. The ring structure is disposed on the substrate and surrounds the semiconductor die, where a first side of the semiconductor die is distant from an inner sidewall of the ring structure by a first gap, and a second side of the semiconductor die is distant from the inner sidewall of the ring structure by a second gap. The first side is opposite to the second side, and the first gap is less than the second gap. The lid is disposed on the ring structure and has a recess formed therein, and the recess overlaps with the first gap in a stacking direction of the ring structure and the lid.

In accordance with some embodiments, a semiconductor package includes a substrate, a semiconductor die and an electromagnetic interference shielding structure. The semiconductor die is disposed on the substrate in an offset position toward an edge of the substrate. The electromagnetic interference shielding structure is disposed on and electrically connected to the substrate, where the semiconductor die is located in a space confined by the substrate and the electromagnetic interference shielding structure, and a recess formed in the electromagnetic interference shielding structure corresponds to the offset position.

In accordance with some embodiments, a method of manufacturing a semiconductor package includes the following steps: providing a semiconductor die; mounting the semiconductor die to a substrate; adhering a ring structure on the substrate to surround the semiconductor die, a first side of the semiconductor die being distant from an inner sidewall of the ring structure by a first gap, and a second side of the semiconductor die being distant from the inner sidewall of the ring structure by a second gap, wherein the first side is opposite to the second side, and the first gap is less than the second gap; and adhering a lid on the ring structure to form an accommodating space with the ring structure and the substrate, the semiconductor die being located in the accommodating space, and the lid comprising a recess formed therein, wherein the recess spatially communicated with the accommodating space and overlapping with the first gap in a stacking direction of the ring structure and the lid.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor package, comprising:
a substrate;
a semiconductor die, disposed on the substrate;
a ring structure, disposed on the substrate and surrounding the semiconductor die, wherein the semiconductor die is eccentric with the ring structure in a vertical projection on the substrate, and an inner sidewall of the ring structure is at least partially in form of a slant sidewall; and
a lid, disposed on the ring structure and having a recess formed therein, the recess is between the semiconductor die and the ring structure in the vertical projection, and a sidewall of the recess is connected to and surrounds a perimeter of a top surface of the recess.

2. The semiconductor package of claim 1, wherein a first side of the semiconductor die is distant from the inner sidewall of the ring structure by a first gap, and a second side of the semiconductor die is distant from the inner sidewall of the ring structure by a second gap, wherein the first side is opposite to the second side, and the first gap is less than the second gap.

3. The semiconductor package of claim 2, wherein the ring structure is in a form of rectangular annulus, wherein:
the first gap is a shortest distance between the first side of the semiconductor die and the inner sidewall of the ring structure as measured in a short axis of the ring structure, and
the second gap is a shortest distance between the second side of the semiconductor die and the inner sidewall of the ring structure as measured in the short axis of the ring structure.

4. The semiconductor package of claim 1, wherein the ring structure is in a form of rectangular annulus, and the package structure further comprises:
one or more than one first semiconductor device, disposed on the substrate and electrically connected to the semiconductor die, wherein the one or more than one first semiconductor device is located within the ring structure and located next to the semiconductor die along a long axis of the ring structure.

5. The semiconductor package of claim 1, wherein the ring structure is in a form of rectangular annulus, and the package structure further comprises:
second semiconductor devices, disposed on the substrate and electrically connected to the semiconductor die, wherein:
the second semiconductor devices are located within the ring structure and located next to the semiconductor die along a short axis of the ring structure;
the second semiconductor devices are located on a side of the substrate opposing to the ring structure; or
a first group of the second semiconductor devices are located within the ring structure and located next to the semiconductor die along a short axis of the ring structure and a second group of the second semiconductor devices are located on a side of the substrate opposing to the ring structure.

6. The semiconductor package of claim 1, wherein the package structure further comprises:
a thermal interface material, located between the lid and the semiconductor die, wherein the lid is thermally coupled and connected to the semiconductor die through the thermal interface material.

7. The semiconductor package of claim 1, wherein the lid is spaced apart from the semiconductor die through an air gap.

8. The semiconductor package of claim 1, wherein the ring structure comprises an outer sidewall opposite to the inner sidewall, and the outer sidewall is substantially aligned with a sidewall of the lid and a sidewall of the substrate.

9. The semiconductor package of claim 1, wherein the ring structure comprises an outer sidewall opposite to the inner sidewall, and the outer sidewall is substantially aligned with a sidewall of the lid and is offset from a sidewall of the substrate.

10. The semiconductor package of claim 1, wherein the ring structure comprises an outer sidewall opposite to the inner sidewall, and the outer sidewall is a substantially vertical sidewall.

11. The semiconductor package of claim 10, wherein a portion of the inner sidewall of the ring structure further comprises a substantially vertical sidewall, wherein the slant sidewall is between the substantially vertical sidewall and the recess formed in the lid in a stacking direction.

12. A semiconductor package, comprising:
a substrate;
a semiconductor die, disposed on the substrate, wherein the semiconductor die is eccentric with the substrate in a vertical projection in a stacking direction of the substrate and the semiconductor die; and an electromagnetic interference shielding structure, disposed on and electrically connected to the substrate, wherein the semiconductor die is in a space confined by the substrate and the electromagnetic interference shielding structure, and a recess formed in the electromagnetic interference shielding structure is between the semiconductor die and the electromagnetic interference shielding structure in the vertical projection, wherein a sidewall of the recess is connected to and surrounds a perimeter of a top surface of the recess, and an inner sidewall of the electromagnetic interference shielding structure is at least partially in form of a slant sidewall.

13. The semiconductor package of claim 12, wherein the electromagnetic interference shielding structure comprises:
    a stiffener ring, disposed on the substrate and surrounding the semiconductor die;
    a first conductive adhesive, located between and adhering the stiffener ring to the substrate;
    a lid, disposed on the stiffener ring and having the recess formed therein; and
    a second conductive adhesive, located between and adhering the lid to the stiffener ring.

14. The semiconductor package of claim 13, wherein a positioning location of the recess is next to and enclosed by a positioning location of the stiffener ring in a vertical projection on the substrate along a stacking direction of the electromagnetic interference shielding structure and the substrate.

15. The semiconductor package of claim 13, wherein a positioning location of the recess is overlapped with a positioning location of the stiffener ring in a vertical projection on the substrate along a stacking direction of the electromagnetic interference shielding structure and the substrate.

16. The semiconductor package of claim 12, further comprising:
    a base substrate, bonded to the substrate through a plurality of conductive terminals, wherein the substrate is located between and electrically connected to the semiconductor die and the base substrate.

17. A semiconductor package, comprising:
    a substrate;
    a semiconductor die, disposed on the substrate;
    a ring structure, disposed on the substrate and surrounding the semiconductor die, wherein the semiconductor die is eccentric with the ring structure in a vertical projection on the substrate; and
    a lid, disposed on the ring structure, the lid comprising a bottom surface facing the semiconductor die and a recess extending from the bottom surface into the lid along a stacking direction of the substrate and the semiconductor die, wherein a first portion of the bottom surface is adhered with the semiconductor die, a second portion of the bottom surface is adhered with the ring structure, and the first portion and the second portion are located at a same level height.

18. The semiconductor package of claim 17, wherein a first sidewall among sidewalls of the recess substantially aligns with a sidewall among sidewalls of the semiconductor die in the stacking direction of the substrate and the semiconductor die, and a second sidewall among the sidewalls of the recess substantially aligns with an inner sidewall among sidewalls of the ring structure in the stacking direction of the substrate and the semiconductor die.

19. The semiconductor package of claim 17, wherein a first sidewall among sidewalls of the recess substantially aligns with a sidewall among sidewalls of the semiconductor die in the stacking direction of the substrate and the semiconductor die, and a second sidewall among the sidewalls of the recess substantially align with a top end of an inclined sidewall among sidewalls of the ring structure in the stacking direction of the substrate and the semiconductor die.

20. The semiconductor package of claim 17, wherein the package structure further comprises:
    a thermal interface material, located between the first portion of the bottom surface and the semiconductor die, wherein the portion of the bottom surface is thermally coupled and connected to the semiconductor die through the thermal interface material.

* * * * *